(12) United States Patent
Tanaka et al.

(10) Patent No.: US 8,304,313 B2
(45) Date of Patent: Nov. 6, 2012

(54) SEMICONDUCTOR DEVICE AND ITS MANUFACTURING METHOD

(75) Inventors: Koichiro Tanaka, Isehara (JP); Atsuo Isobe, Atsugi (JP); Yoshiaki Yamamoto, Hadano (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 1271 days.

(21) Appl. No.: 10/585,128

(22) PCT Filed: Aug. 12, 2005

(86) PCT No.: PCT/JP2005/015114
§ 371 (c)(1),
(2), (4) Date: Jun. 30, 2006

(87) PCT Pub. No.: WO2006/022196
PCT Pub. Date: Mar. 2, 2006

(65) Prior Publication Data
US 2009/0173893 A1    Jul. 9, 2009

(30) Foreign Application Priority Data
Aug. 23, 2004    (JP) .................. 2004-243044

(51) Int. Cl.
*H01L 21/8236* (2006.01)
(52) U.S. Cl. .............. 438/269; 438/166; 438/393
(58) Field of Classification Search .......... 438/166, 438/269, 393, 418, 487, 716, FOR. 408
See application file for complete search history.

(56) References Cited

U.S. PATENT DOCUMENTS

| | | | |
|---|---|---|---|
| 4,262,208 A | 4/1981 | Suzki et al. | |
| 4,420,233 A | 12/1983 | Nomoto et al. | |
| 4,734,550 A | 3/1988 | Imamura et al. | |
| 4,743,932 A | 5/1988 | Matsui | |
| 4,851,978 A | 7/1989 | Ichihara | |
| 4,861,964 A | 8/1989 | Sinohara | |
| 4,879,451 A | 11/1989 | Gart | |
| 4,942,588 A | 7/1990 | Yasui et al. | |
| 4,990,763 A * | 2/1991 | Shinada ................. | 250/205 |

(Continued)

FOREIGN PATENT DOCUMENTS
CN    1461045    12/2003
(Continued)

OTHER PUBLICATIONS

Search Report (Application No. PCT/JP2005/015114) dated Nov. 22, 2005.

(Continued)

*Primary Examiner* — N Drew Richards
*Assistant Examiner* — Joannie A Garcia
(74) *Attorney, Agent, or Firm* — Eric J. Robinson; Robinson Intellectual Property Law Office, P.C.

(57) ABSTRACT

It is an object of the present invention to provide laser irradiation apparatus and method which can decrease the proportion of the microcrystal region in the whole irradiated region and can irradiate a semiconductor film homogeneously with a laser beam. A low-intensity part of a laser beam emitted from a laser oscillator is blocked by a slit, the laser beam is deflected by a mirror, and the beam is shaped into a desired size by using two convex cylindrical lenses. Then, the laser beam is delivered to the irradiation surface.

24 Claims, 28 Drawing Sheets

U.S. PATENT DOCUMENTS

| | | |
|---|---|---|
| 5,005,969 A | 4/1991 | Kataoka |
| 5,010,230 A | 4/1991 | Uemura |
| 5,059,013 A | 10/1991 | Jain |
| RE33,947 E | 6/1992 | Shinohara |
| 5,134,426 A | 7/1992 | Kataoka et al. |
| 5,145,808 A | 9/1992 | Sameshima et al. |
| 5,307,184 A | 4/1994 | Nishiwaki et al. |
| 5,608,492 A | 3/1997 | Sato |
| 5,643,801 A | 7/1997 | Ishihara et al. |
| 5,721,416 A | 2/1998 | Burghardt et al. |
| 5,728,215 A | 3/1998 | Itagaki et al. |
| 5,756,364 A | 5/1998 | Tanaka et al. |
| 5,815,494 A | 9/1998 | Yamazaki et al. |
| 5,932,118 A | 8/1999 | Yamamoto et al. |
| 6,002,523 A | 12/1999 | Tanaka |
| 6,008,101 A | 12/1999 | Tanaka et al. |
| 6,008,144 A | 12/1999 | Shih et al. |
| 6,100,961 A | 8/2000 | Shiraishi et al. |
| 6,168,968 B1 | 1/2001 | Umemoto et al. |
| 6,172,820 B1 | 1/2001 | Kuwahara |
| 6,187,088 B1 | 2/2001 | Okumura |
| 6,246,524 B1 | 6/2001 | Tanaka |
| 6,259,512 B1 | 7/2001 | Mizouchi |
| 6,323,937 B1 | 11/2001 | Sano |
| 6,353,218 B1 | 3/2002 | Yamazaki et al. |
| 6,388,386 B1 | 5/2002 | Kunii et al. |
| 6,393,042 B1 | 5/2002 | Tanaka |
| 6,429,100 B2 | 8/2002 | Yoneda |
| 6,437,313 B2 | 8/2002 | Yamazaki et al. |
| 6,495,405 B2 | 12/2002 | Voutsas et al. |
| 6,528,397 B1 | 3/2003 | Taketomi et al. |
| 6,563,567 B1 | 5/2003 | Komatsuda et al. |
| 6,573,163 B2 | 6/2003 | Voutsas et al. |
| 6,642,091 B1 | 11/2003 | Tanabe |
| 6,664,147 B2 | 12/2003 | Voutsas |
| 6,676,878 B2 | 1/2004 | O'Brien et al. |
| 6,686,978 B2 | 2/2004 | Voutsas |
| 6,753,212 B2 * | 6/2004 | Yamazaki et al. ............ 438/166 |
| 6,777,276 B2 | 8/2004 | Crowder et al. |
| 6,787,755 B2 | 9/2004 | Yamazaki et al. |
| 6,818,484 B2 | 11/2004 | Voutsas |
| 6,852,609 B2 | 2/2005 | Yang |
| 6,852,947 B2 | 2/2005 | Tanaka |
| 6,861,614 B1 | 3/2005 | Tanabe et al. |
| 6,870,125 B2 | 3/2005 | Doi et al. |
| 6,885,432 B2 | 4/2005 | Tsuji |
| 6,891,175 B2 | 5/2005 | Hiura |
| 6,908,835 B2 | 6/2005 | Sposili et al. |
| 6,911,659 B1 | 6/2005 | Malo |
| 6,949,452 B2 | 9/2005 | Hatano et al. |
| 6,961,361 B1 | 11/2005 | Tanaka |
| 6,977,775 B2 | 12/2005 | Sasaki et al. |
| 6,984,573 B2 | 1/2006 | Yamazaki et al. |
| 6,989,300 B1 | 1/2006 | Tanabe |
| 6,989,524 B2 | 1/2006 | Yamazaki et al. |
| 7,049,184 B2 | 5/2006 | Tanabe |
| 7,063,999 B2 | 6/2006 | Tanabe et al. |
| 7,078,281 B2 | 7/2006 | Tanaka et al. |
| 7,078,322 B2 | 7/2006 | Tanada et al. |
| 7,105,048 B2 | 9/2006 | Yamazaki et al. |
| 7,115,457 B2 | 10/2006 | Sasaki et al. |
| 7,164,152 B2 | 1/2007 | Im |
| 7,192,852 B2 | 3/2007 | Hatano et al. |
| 7,223,644 B2 | 5/2007 | Inoue et al. |
| 7,230,316 B2 | 6/2007 | Yamazaki et al. |
| 7,252,910 B2 | 8/2007 | Hasegawa et al. |
| 7,253,120 B2 | 8/2007 | Glazer et al. |
| 7,259,081 B2 | 8/2007 | Im |
| 7,402,772 B2 | 7/2008 | Hamada et al. |
| 7,408,144 B2 | 8/2008 | Yamazaki et al. |
| 7,410,508 B2 | 8/2008 | Sasaki et al. |
| 7,468,312 B2 | 12/2008 | Tanaka |
| 7,517,773 B2 | 4/2009 | Tanada et al. |
| 7,528,023 B2 | 5/2009 | Sasaki et al. |
| 7,541,230 B2 | 6/2009 | Sasaki et al. |
| 7,660,042 B2 | 2/2010 | Sasaki et al. |
| 7,666,769 B2 | 2/2010 | Hatano et al. |
| 7,927,935 B2 | 4/2011 | Sasaki et al. |
| 8,026,152 B2 | 9/2011 | Yamazaki et al. |
| 2001/0046088 A1 | 11/2001 | Sano et al. |
| 2002/0047847 A1 * | 4/2002 | Tamura ..................... 345/534 |
| 2002/0102821 A1 | 8/2002 | Voutsas |
| 2003/0068836 A1 | 4/2003 | Hongo et al. |
| 2003/0086182 A1 | 5/2003 | Tanaka et al. |
| 2003/0103176 A1 * | 6/2003 | Abe et al. ..................... 349/113 |
| 2003/0150843 A1 | 8/2003 | Doi et al. |
| 2003/0153182 A1 | 8/2003 | Yamazaki et al. |
| 2003/0216012 A1 | 11/2003 | Sasaki et al. |
| 2004/0041158 A1 | 3/2004 | Hongo et al. |
| 2004/0164306 A1 * | 8/2004 | Hongo et al. .................. 257/88 |
| 2004/0195222 A1 | 10/2004 | Tanaka et al. |
| 2004/0228004 A1 | 11/2004 | Sercel et al. |
| 2004/0266223 A1 * | 12/2004 | Tanaka et al. ................ 438/795 |
| 2005/0227504 A1 | 10/2005 | Sasaki et al. |
| 2005/0247684 A1 | 11/2005 | Tanaka |
| 2005/0247685 A1 | 11/2005 | Tanaka |
| 2005/0282408 A1 | 12/2005 | Sasaki et al. |
| 2007/0077696 A1 | 4/2007 | Tanaka et al. |
| 2007/0158315 A1 | 7/2007 | Tanaka et al. |
| 2012/0007159 A1 | 1/2012 | Yamazaki et al. |

FOREIGN PATENT DOCUMENTS

| | | |
|---|---|---|
| EP | 1 304 186 | 4/2003 |
| JP | 04-307727 A | 10/1992 |
| JP | 10-286683 A | 10/1998 |
| JP | 11-186189 A | 7/1999 |
| JP | 2000-058478 A | 2/2000 |
| JP | 2001-068430 A | 3/2001 |
| JP | 2001-156017 A | 6/2001 |
| JP | 2003-218056 A | 7/2003 |
| JP | 2003-229359 A | 8/2003 |
| JP | 2003-257885 | 9/2003 |
| JP | 2003-332236 A | 11/2003 |
| JP | 2004-056058 A | 2/2004 |
| JP | 2004-103628 A | 4/2004 |
| JP | 2004-179356 A | 6/2004 |
| JP | 2004-193201 A | 7/2004 |
| JP | 2004-221570 A | 8/2004 |

OTHER PUBLICATIONS

Written Opinion (Application No. PCT/JP2005/015114) dated Nov. 22, 2005.

Chinese Office Action (Application No. 200910159435.X) Dated May 16, 2011.

* cited by examiner

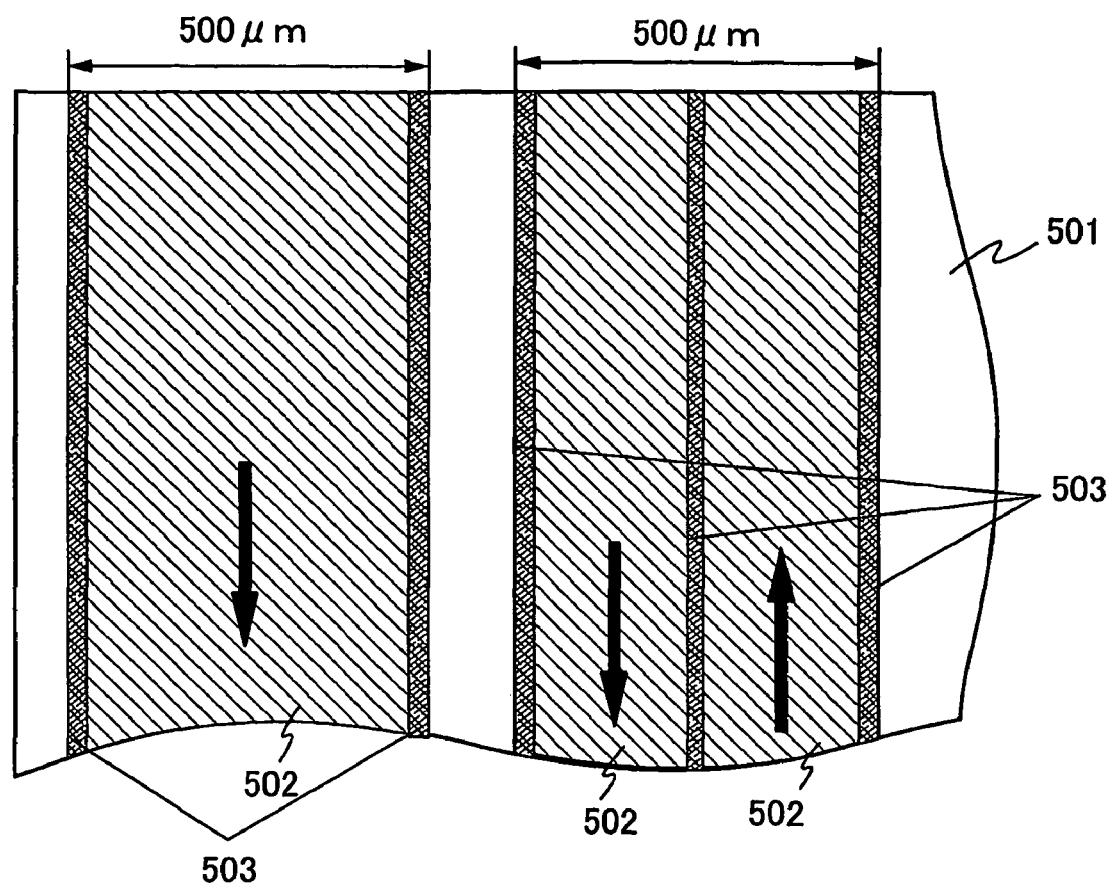

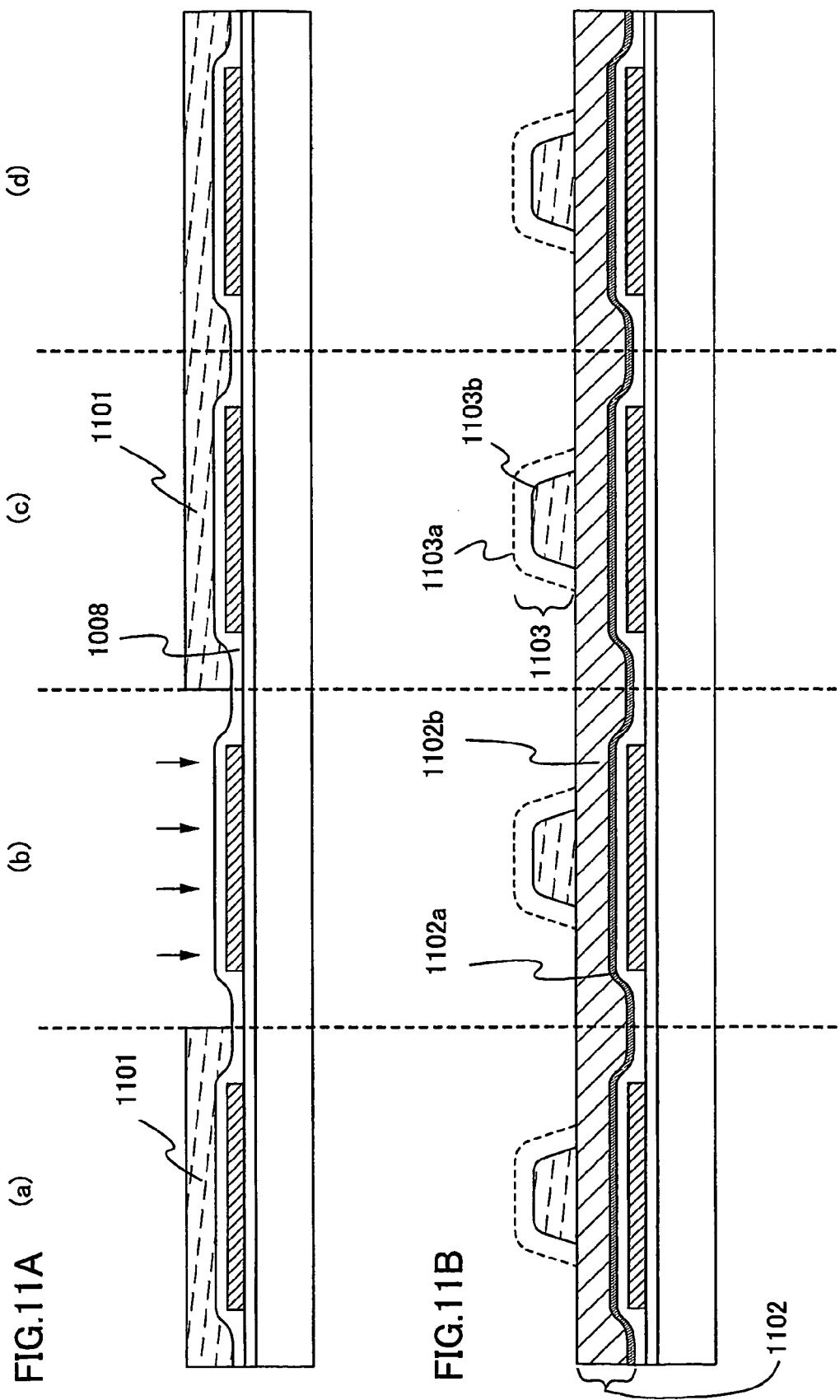

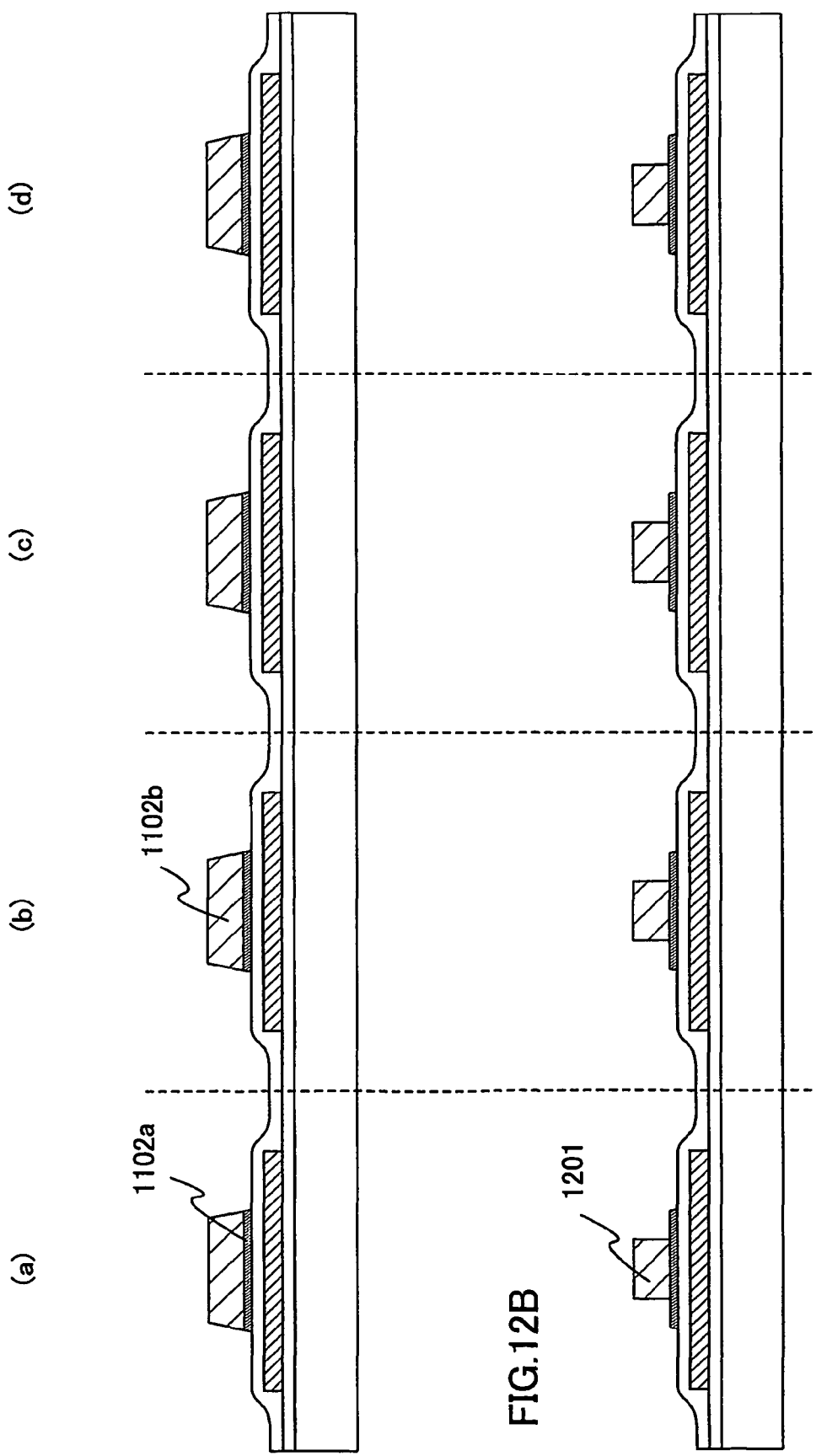

(a)

(b)　　　　　　　　　　　　　　　　　　　　　　(b)

SEMICONDUCTOR DEVICE AND ITS MANUFACTURING METHOD

1. TECHNICAL FIELD

The present invention relates to a laser irradiation apparatus (an apparatus including a laser and an optical system for guiding a laser beam emitted from the laser to an irradiation object) and a laser irradiation method, which anneal a semiconductor material or the like homogeneously and effectively. The present invention further relates to a semiconductor device manufactured by including a step of the laser process and to its manufacturing method.

2. BACKGROUND ART

In recent years, a technique to form a thin film transistor (hereinafter referred to as a TFT) over a substrate has made great progress and application to an active matrix display device has been advanced. In particular, a TFT formed using a poly-crystalline semiconductor film is superior in field-effect mobility to a TFT formed using a conventional amorphous semiconductor film; therefore, high-speed operation has become possible. For this reason, it is tried that a pixel, which has been controlled by a driver circuit provided outside a substrate, is controlled by a driver circuit formed over the same substrate as the pixel.

A substrate used in a semiconductor device is expected to be a glass substrate rather than a quartz substrate or a single-crystal semiconductor substrate in terms of cost. However, the glass substrate is inferior in heat resistance and easy to be deformed due to the heat. Therefore, when the TFT using the poly-crystalline semiconductor film is formed over the glass substrate, a laser irradiation method (referred to as laser annealing) is employed to crystallize a semiconductor film in order to prevent the glass substrate from being deformed due to the heat.

Compared with another annealing method which uses radiant heat or conductive heat, the laser annealing has advantages in that the processing time can be shortened drastically and that a semiconductor substrate or a semiconductor film over a substrate can be heated selectively and locally so that almost no thermal damage is given to the substrate. The laser annealing method described here indicates a technique to recrystallize an amorphous layer or a damaged layer formed in a semiconductor substrate or a semiconductor film, and a technique to crystallize a non-single crystal semiconductor film formed over a substrate. Further, a technique applied to planarization or modification of the surface of a semiconductor substrate or a semiconductor film is also included.

Laser oscillators used for the laser annealing can be broadly divided into two categories: pulsed laser oscillators and continuous wave (CW) laser oscillators according to the oscillation method. In recent years, it has been known that the size of a crystal grain formed in a semiconductor film becomes larger when using a CW laser oscillator such as an Ar laser or a $YVO_4$ laser than when using a pulsed laser oscillator such as an excimer laser at the crystallization of the semiconductor film. When the size of the crystal grain in the semiconductor film becomes larger, the number of grain boundaries in a channel-forming region of a TFT formed with this semiconductor film decreases; therefore, the mobility increases. Accordingly, thus manufactured TFT can be used to develop a more sophisticated device. This is the reason why the CW laser is attracting attention.

Generally, when a silicon film having a thickness of several tens to several hundred nm usually used in a semiconductor device is crystallized with a CW YAG laser or $YVO_4$ laser, a second harmonic having a shorter wavelength than the fundamental wave is used. This is because the second harmonic has higher absorption coefficient to the semiconductor film than the fundamental wave, which allows more effective crystallization of a silicon film. The fundamental wave is hardly employed in the step of crystallizing the silicon film by irradiating the silicon film with a laser beam.

As an example of this step, the following is given; a CW laser beam with a power of 10 W at the second harmonic (532 nm) is shaped into a linear spot having a length of 300 μm in the major-axis direction and 10 μm in the minor-axis direction and the beam spot is moved in the minor-axis direction to irradiate a semiconductor film. A region having large crystal grains that is obtained by one scanning has a width of approximately 200 μm (hereinafter the region having large crystal grains is referred to as a large crystal grain region). For this reason, in order to crystallize the whole surface of the substrate by laser irradiation, the laser irradiation needs to be conducted in such a way that the beam spot is displaced in the major-axis direction by the width of the large crystal grain region obtained by one scanning of the beam spot.

The invention in which a semiconductor film is irradiated with a laser beam shaped into a linear spot at an irradiation surface has been disclosed in Japanese Patent Application Laid-Open No.: 2003-257885

DISCLOSURE OF THE INVENTION

FIG. 20 shows an irradiation track of a beam spot 2001 on a semiconductor film and energy density distribution 2002 at a cross section A of the beam spot 2001.

Usually, a cross section of a laser beam emitted from a CW laser oscillator with $TEM_{00}$ mode (single transverse mode) has Gaussian energy distribution as shown with 2002 in FIG. 20 and does not have homogeneous energy density distribution.

For example, the energy density of the beam spot in its central portion 2003 is set higher than the threshold (y) at which one crystal grain that is large enough to form at least one TFT therein is obtained. This crystal grain is hereinafter referred to as a large crystal grain. The energy density of the beam spot in its end portion 2004 is higher than the threshold (x) at which a crystalline region is formed and is lower than the threshold (y). Therefore, when the semiconductor film is irradiated with the laser beam, some parts of a region irradiated with the end portion 2004 of the beam spot are not melted completely. In this unmelted region, not the large crystal grain which is formed by the central portion of the beam spot but only a crystal grain having relatively small grain diameter (hereinafter referred to as a microcrystal) is formed.

A semiconductor element formed in the region where the microcrystal is formed, that is, the region irradiated with the end portion 2004 of the beam spot cannot be expected to have high characteristic. In order to avoid this, it is necessary to form the semiconductor element in the region where the large crystal grain is formed, that is, the region irradiated with the central portion 2003 of the beam spot. In such a case, it is apparent that the layout is restricted. Accordingly, it is required to decrease the proportion of the region where the microcrystal is formed (hereinafter this region is referred to as a microcrystal region) in the whole region irradiated with the laser beam.

In order to avoid this, a method is given in which the intensity distribution of the laser beam is changed from the Gaussian shape into a top-flat shape. A technique for shaping the distribution into the top-flat shape has been introduced in, for example, catalogues of laser manufactures. In this technique, a diffractive optical element or an optical waveguide is used. By having the top-flat intensity distribution, the laser beam can have the intensity distribution which is steep in its end portions, which can drastically decrease the microcrystal region formed after the laser beam irradiation. Furthermore, even when the linear beam becomes longer in the major-axis direction, the microcrystal region can be decreased.

As thus described, the top-flat distribution has advantages. However, the technique using a diffractive optical element has some problems of technical difficulty and high cost because the diffractive optical element needs a microscopic process with the accuracy in units of nanometer in order to obtain high characteristic. The technique using an optical waveguide also has a problem of interference fringes appearing on the irradiation surface due to the high and low intensity of the laser beam because the laser beam having a wavelength of 532 nm has coherency to the semiconductor film.

Although the laser beam having the energy distribution shown in FIG. 20 is simply shaped into a linear or rectangular spot, the energy density is lower in the end portion of the laser beam than in the central portion thereof. Therefore, the energy density distribution of the laser beam needs to be equal to or higher than that for forming the large crystal grain region.

In view of the above problems, it is an object of the present invention to provide a laser irradiation apparatus which can decrease the proportion of the microcrystal region in the whole region irradiated with the laser beam and which can conduct a laser process to the semiconductor film homogeneously.

To achieve the above object, the present invention employs the following structure. It is to be noted that the laser annealing method herein described indicates a technique to crystallize an amorphous region or a damaged region formed by, for example, implanting ions into a semiconductor substrate or a semiconductor film, a technique to crystallize a semiconductor film which is not single crystal (referred to as a non-single crystal semiconductor film) formed over a substrate by irradiating the semiconductor film with a laser beam, a technique to crystallize a non-single crystal semiconductor film by conducting laser irradiation after introducing a crystallization-inducing element such as nickel into the non-single crystal semiconductor film, and so on.

Moreover, a technique applied for planarization or modification of a surface of a semiconductor substrate or a semiconductor film is also included. A semiconductor device herein described indicates all the devices which can operate by using a semiconductor characteristic and includes electro-optic devices such as a liquid crystal display device and a light-emitting device, and further includes electronic devices having such electro-optic devices as their components.

According to one aspect of the present invention, a laser irradiation apparatus comprises a laser oscillator, a slit for blocking opposite end portions of a laser beam emitted from the laser oscillator, a condensing lens, means for projecting an image of the laser beam formed at the slit onto an irradiation surface, and means for moving the irradiation surface relative to the laser beam.

According to another aspect of the present invention, a laser irradiation apparatus comprises a first laser oscillator, a second laser oscillator, a waveplate for changing a polarizing direction of a laser beam emitted from the first laser oscillator, a polarizer for combining a plurality of beams, a slit for blocking opposite end portions of the combined laser beam, a condensing lens for projecting an image of the laser beam formed at the slit onto an irradiation surface, and means for moving the irradiation surface relative to the laser beam.

In the above structure of the present invention, the condensing lens is a plurality of convex cylindrical lenses or a convex spherical lens.

In the above structure of the present invention, the following laser oscillators can be employed: (1) a CW laser such as a laser having a medium of a single-crystal YAG, $YVO_4$, forsterite ($Mg_2SiO_4$), $YAlO_3$, or $GdVO_4$, or a poly-crystal (ceramic) YAG, $Y_2O_3$, $YVO_4$, $YAlO_3$, or $GdVO_4$, each of which is doped with one or a plurality of Nd, Yb, Cr, Ti, Ho, Er, Tm, and Ta as dopant, a solid-state laser such as an alexandrite laser or a Ti:sapphire laser, a gas laser such as an Ar laser or a Kr laser, or a semiconductor laser such as a GaN laser, a GaAs laser, or an InAs laser; (2) a laser having a pulse width of femtoseconds (1 femtosecond=$10^{-15}$ second, also referred to as a femtosecond laser) such as a Ti:sapphire laser, a laser using a chromium.forsterite crystal, or a Yb:YAG laser (the pulse width becomes femtoseconds by locking the mode); or (3) a pulsed laser having a repetition rate of 10 MHz or more such as a laser having a medium of a single-crystal YAG, $YVO_4$, forsterite ($Mg_2SiO_4$), $YAlO_3$, or $GdVO_4$, or a poly-crystal (ceramic) YAG, $Y_2O_3$, $YVO_4$, $YAlO_3$, or $GdVO_4$, each of which is doped with one or a plurality of Nd, Yb, Cr, Ti, Ho, Er, Tm, and Ta as dopant, an Ar ion laser, or a Ti:sapphire laser. It is to be noted that, in this specification, the ceramic means an inorganic solid-state material manufactured artificially by heat or the like.

In the above structure of the present invention, the laser beam is converted into a harmonic as necessary by a non-linear optical element such as BBO ($\beta$-$BaB_2O_4$, barium borate), LBO ($Li_2B_4O_7$, lithium borate), KTP ($KTiOPO_4$, potassium titanyl phosphate), $LiNbO_3$ (lithium niobate), KDP ($KH_2PO_4$, potassium dihydrogen phosphate), $LiIO_3$ (lithium iodate), ADP ($NH_4H_2PO_4$, ammonium dihydrogen phosphate), BIBO ($BiB_3O_6$, bismuth triborate), CLBO ($CsLiB_6O_{10}$, cesium lithium borate), or KB5 ($KB_5O_8.4H_2O$, potassium pentaborate).

In the above structure of the present invention, the one width of the microcrystal region in the laser irradiation region ranges from 1 to 20 μm by employing the laser irradiation apparatus of the present invention.

According to the present invention, a laser irradiation apparatus can be provided which can suppress the one width of the microcrystal region in the laser irradiation region to 1 to 20 μm and which can conduct a laser process to a semiconductor film homogeneously when the semiconductor film is crystallized with a laser.

BRIEF DESCRIPTION OF THE DRAWINGS

In the accompanying drawings:

FIGS. 5A and 5B schematically show laser irradiation according to the present invention;

FIGS. 11A and 11B schematically show a process for manufacturing a TFT with the use of laser irradiation according to the present invention;

FIGS. 12A and 12B schematically show a process for manufacturing a TFT with the use of laser irradiation according to the present invention;

DETAILED DESCRIPTION OF THE INVENTION

Embodiment Mode and Embodiments of the present invention are hereinafter described with reference to the drawings. However, since the present invention can be carried out in many different modes, it is to be understood by those skilled in the art that the modes and details of the present invention can be changed variously without departing from the spirit and the scope of the present invention. Therefore, the present invention is not limited to the description of Embodiment Mode and Embodiments.

The present invention includes two main modes: a first laser irradiation method that uses a convex cylindrical lens and a second laser irradiation method that uses a convex spherical lens. The first laser irradiation method further includes two modes in one of which a laser beam vertically enters an irradiation surface and in the other of which a laser beam obliquely enters an irradiation surface. This embodiment mode describes the first laser irradiation method hereinafter.

Figure 1:
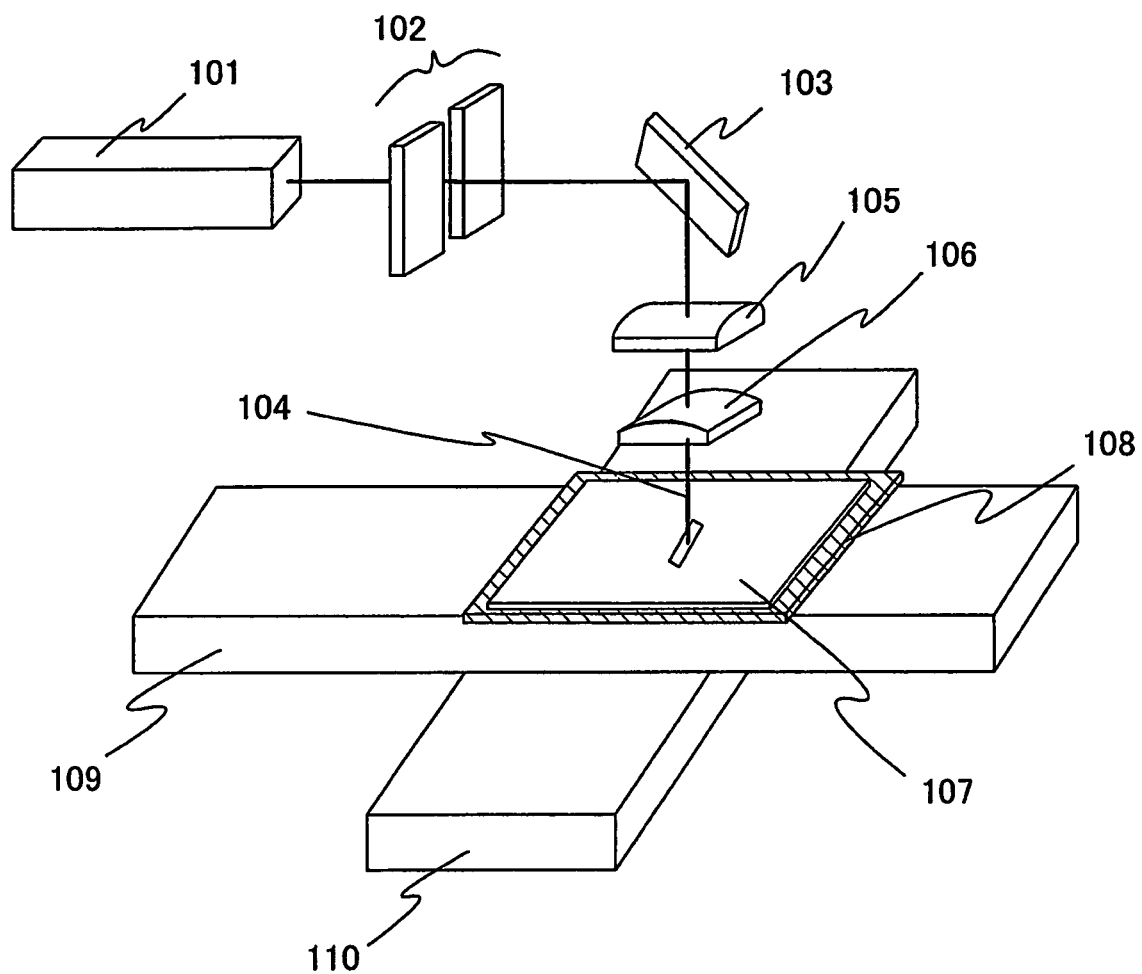
FIG. 1 schematically shows the present invention.

A laser oscillator 101 shown in FIG. 1 is not limited in particular. As the laser oscillator 101, the following laser oscillators can be employed: (1) a CW laser such as a laser having a medium of a single-crystal YAG, YVO$_4$, forsterite (Mg$_2$SiO$_4$), YAlO$_3$, or GdVO$_4$, or a poly-crystal (ceramic) YAG, Y$_2$O$_3$, YVO$_4$, YAlO$_3$, or GdVO$_4$, each of which is doped with one or a plurality of Nd, Yb, Cr, Ti, Ho, Er, Tm, and Ta as dopant, a solid-state laser such as an alexandrite laser or a Ti:sapphire laser, a gas laser such as an Ar laser or a Kr laser, or a semiconductor laser such as a GaN laser, a GaAs laser, or an InAs laser; (2) a laser having a pulse width of femtoseconds (1 femtosecond=$10^{-15}$ second, also referred to as a femtosecond laser) such as a Ti:sapphire laser, a laser using a chromium-forsterite crystal, or a Yb:YAG laser; or (3) a pulsed laser having a repetition rate of 10 MHz or more such as a laser having a medium of a single-crystal YAG, YVO$_4$, forsterite (Mg$_2$SiO$_4$), YAlO$_3$, or GdVO$_4$, or a poly-crystal (ceramic) YAG, Y$_2$O$_3$, YVO$_4$, YAlO$_3$, or GdVO$_4$, each of which is doped with one or a plurality of Nd, Yb, Cr, Ti, Ho, Er, Tm, and Ta as dopant, an Ar ion laser, or a Ti:sapphire laser.

A fundamental wave having a wavelength of approximately 1 µm is not absorbed that much in a semiconductor film, which means the absorption efficiency is low. However, when the semiconductor film is irradiated with a fundamental wave emitted from a femtosecond laser, a plurality of photons are simultaneously absorbed in one atom (or a molecule) at the focal point of the laser beam or its vicinity, i.e. multiphoton absorption occurs. As a result, the laser beam can be absorbed in the semiconductor film so that the semiconductor film can be melted.

A laser having a medium of a single-crystal YAG, YVO$_4$, forsterite (Mg$_2$SiO$_4$), YAlO$_3$, or GdVO$_4$, or a poly-crystal (ceramic) YAG, Y$_2$O$_3$, YVO$_4$, YAlO$_3$, or GdVO$_4$, each of which is doped with one or a plurality of Nd, Yb, Cr, Ti, Ho, Er, Tm, and Ta as dopant, an Ar ion laser, or a Ti:sapphire laser can emit a continuous wave laser beam and also can emit a pulsed laser beam with a repetition rate of 10 MHz or more by conducting a Q-switch operation or mode synchronization. When the laser beam is emitted with a repetition rate of 10 MHz or more, the semiconductor film is irradiated with the laser beam after the semiconductor film is melted by the previous laser beam and before the semiconductor film is solidified. Therefore, unlike the case of using a pulsed laser having low repetition rate, the interface between the solid phase and the liquid phase can be moved continuously in the semiconductor film, thereby obtaining a crystal grain grown continuously in the scanning direction.

When ceramic (polycrystal) is used as a medium, the medium can be transformed into a desired shape in short time and at low cost. In the case of using a single crystal, usually, a cylindrical medium having a diameter of several mm and a length of several tens mm is used; however, the medium made of ceramic can have a larger size.

Since the concentration of dopant such as Nd or Yb in the medium, which directly contributes to the light emission, cannot be changed drastically either in a single crystal or a poly crystal, the increase in the output power of the laser by increasing the concentration is limited to some extent. In the case of the ceramic, however, drastic increase in the output power can be expected because the medium can be made much larger than that of the single crystal.

Further, in the case of ceramic, a parallelepiped or cuboid medium can be easily formed. When an oscillated laser beam zigzags inside a medium having such a shape, the optical path of the oscillated laser beam can be made longer. For this reason, the laser beam is amplified greatly, thereby emitting the laser beam with high output power. Moreover, the laser beam emitted from the parallelepiped or cuboid medium has a square cross-sectional shape at the emission from the medium, and also has almost homogeneous intensity distribution. Accordingly, this laser beam is advantageous in transforming into a linear beam as compared with a beam having a circular beam spot. By shaping the laser beam emitted thus with an optical system, a linear beam having a length of 1 mm or less in its minor-axis and a length of several mm to several m in its major axis can be easily obtained. By homogeneously irradiating the medium with the excited beam, the linear beam has homogeneous energy distribution in the major-axis direction. The present invention is particularly effective even in the case of using such a beam spot whose long side is long because the width of the microcrystal region ranges from 1 to 20 µm.

When the laser beam is emitted from the laser oscillator 101, the laser beam is converted into any one of second to fourth harmonics as necessary using a known non-linear optical element such as BBO, LBO, KTP, KDP, $LiNbO_3$, $LiIO_3$, CLBO, ATP, BIBO, or KB5 and emitted with $TEM_{00}$ mode (single transverse mode). When the above-described femtosecond laser is used, the non-linear optical element is not necessary because the fundamental wave is used.

When the laser beam having the fundamental wave or any one of the second to fourth harmonics of the fundamental wave is delivered, a large crystal grain can be obtained. For example, the second harmonic (532 nm) or the third harmonic (355 nm) of a $Nd:YVO_4$ laser (fundamental wave of 1064 nm) can be used. At this time, the energy density of the laser beam needs to be approximately 0.01 to 100 $MW/cm^2$ (preferably 0.1 to 10 $MW/cm^2$).

Figure 2A:
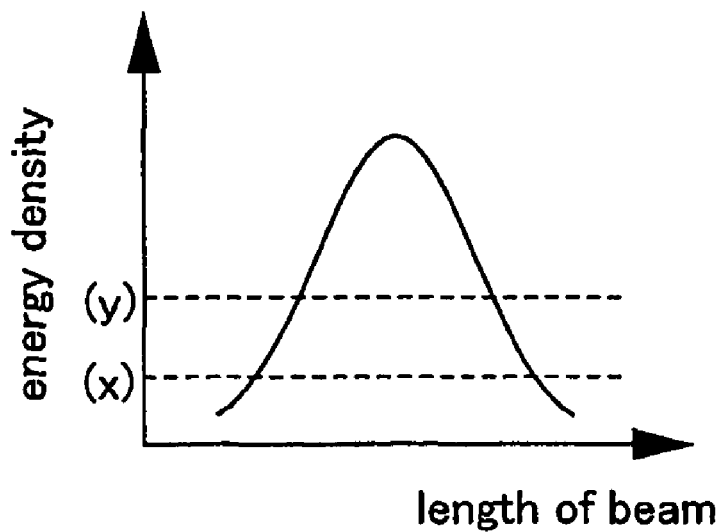
FIGS. 2A and 2B show energy density distribution of a laser beam.

The laser beam emitted from the laser oscillator 101 passes through a slit 102. A low-energy region of a linear or rectangular beam 104 at its opposite ends can be blocked as much as possible by providing the slit 102 so as to act on the major-axis direction of the linear or rectangular laser beam 104. At the same time, the length of the linear or rectangular beam 104 in the major-axis direction can be adjusted. That is to say, the laser beam has energy density distribution shown in FIG. 2A just after the emission from the laser oscillator; however, the laser beam has energy density distribution shown with a solid line in FIG. 2B by passing through the slit.

Figure 3:
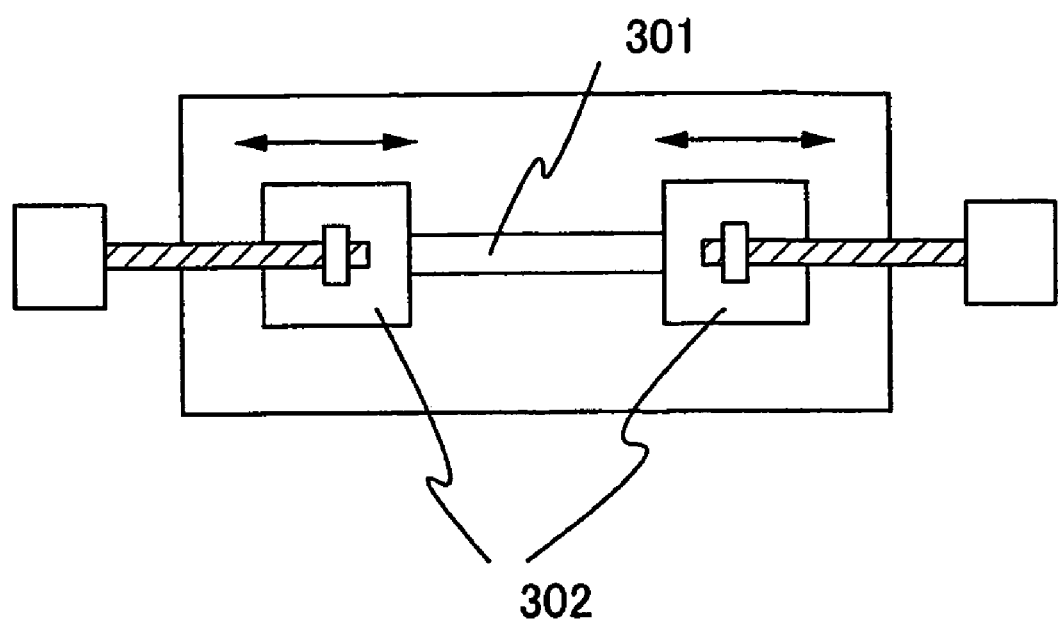
FIG. 3 schematically shows a slit used in the present invention.

The slit 102 used in the present invention is not limited in particular as long as the slit has a shape or a structure which can block a low-intensity part of the laser beam when the laser beam passes through the slit. For example, a slit shown in FIG. 3 can be used to block the part of the laser beam.

The slit has a rectangular slit opening portion 301 in its center and blocking plates 302 at its opposite end portions in a long-side direction of the slit opening portion 301. The blocking plates 302 are opened and closed in accordance with the kind or the energy of the laser so as to adjust the energy distribution.

Thus, by adjusting the blocking plates 302 at the opposite ends of the slit opening portion 301 in accordance with the kind or the energy of the laser, it is possible to cut particularly a part of the rectangular laser beam that has inhomogeneous energy distribution at the opposite end portions in the long-side direction as necessary.

Next, the traveling direction of the laser beam is changed by a mirror 103.

After that, the linear or rectangular beam 104 is formed on an irradiation surface by convex cylindrical lenses 105 and 106 acting on the major-axis and minor-axis directions of the linear or rectangular beam 104. In this embodiment mode, the two convex cylindrical lenses 105 and 106 are used as the condensing lens. One of the convex cylindrical lenses 105 and 106 shapes the laser beam in the major-axis direction of the linear or rectangular beam and the other shapes the laser beam in the minor-axis direction thereof.

The advantage in using the convex cylindrical lenses 105 and 106 is that the laser beam can be condensed independently in the major-axis direction and the minor-axis direction. The convex cylindrical lens is not limited in particular, and a cylindrical lens having any structure and any shape can be used as long as the cylindrical lens can extend the beam in only one direction to form a rectangular, long elliptical, or linear beam. Such a convex cylindrical lens may have a convex surface on a side where the laser beam enters or on a side where the laser beam is emitted, or have convex surfaces on both sides. It is preferable, however, that the lens have a convex surface on a side where the laser beam enters in point of the accuracy and low aberration.

When the beam diameter, output power, and beam shape of the laser beam emitted from the laser oscillator can be used without any changes, two convex cylindrical lenses are not necessarily used. In addition, when the laser beam is condensed while keeping the ratio of the length between the major axis and the minor axis of the laser beam at the emission from the oscillator, a convex spherical lens may be used instead of the convex cylindrical lenses.

A substrate 107 with a semiconductor film formed thereover is made of glass and fixed to a suction stage 108 so as not to fall during the laser irradiation. The suction stage 108 is moved repeatedly in XY directions on a plane parallel to the surface of the semiconductor film with the use of an X stage 109 and a Y stage 110 to crystallize the semiconductor film.

Since the energy is not enough at the opposite ends of the linear or rectangular laser beam, the semiconductor film is not melted completely. Therefore, a microcrystal region is formed. However, since the opposite end portions of the linear or rectangular laser beam not having enough energy can be blocked before the laser beam is delivered to the semiconductor film, the semiconductor film can be crystallized homogeneously.

Embodiment 1

This embodiment describes the first laser irradiation method and apparatus in which a laser beam whose low-intensity portion has been blocked enters an irradiation surface perpendicularly. Since the same drawings as those in Embodiment Mode are used in this embodiment, the same element is denoted with the same reference numeral.

The laser oscillator 101 in FIG. 1 is a mode-locked pulsed laser oscillator having an output power of 10 W, a repetition rate of 80 MHz, a pulse width of 10 ps, a wavelength of 532 nm, a beam diameter of 1.0 mm, and $TEM_{00}$ mode (single transverse mode). The mode-locked pulsed laser used here has the repetition rate which is extremely higher than a repetition rate of several tens to several hundred Hz of a conventional pulsed laser. It is said that it takes several tens to several hundred ns to completely solidify the semiconductor film after irradiating the semiconductor film with a pulsed laser beam. With the pulsed laser oscillator having a repetition rate of 10 MHz or more, the semiconductor film can be irradiated with a laser beam after the semiconductor film is melted by the previous laser beam and before the semiconductor film is solidified.

Unlike the case of using a conventional pulsed laser, an interface between a solid phase and a liquid phase can be moved continuously in the semiconductor film, thereby forming a semiconductor film having crystal grains grown continuously in the scanning direction. Specifically, an aggregation of crystal grains each having a width of 10 to 30 µm, preferably 10 to 60 µm, in the scanning direction and a width of 1 to 5 µm in a direction perpendicular to the scanning direction is formed.

Figure 2B:
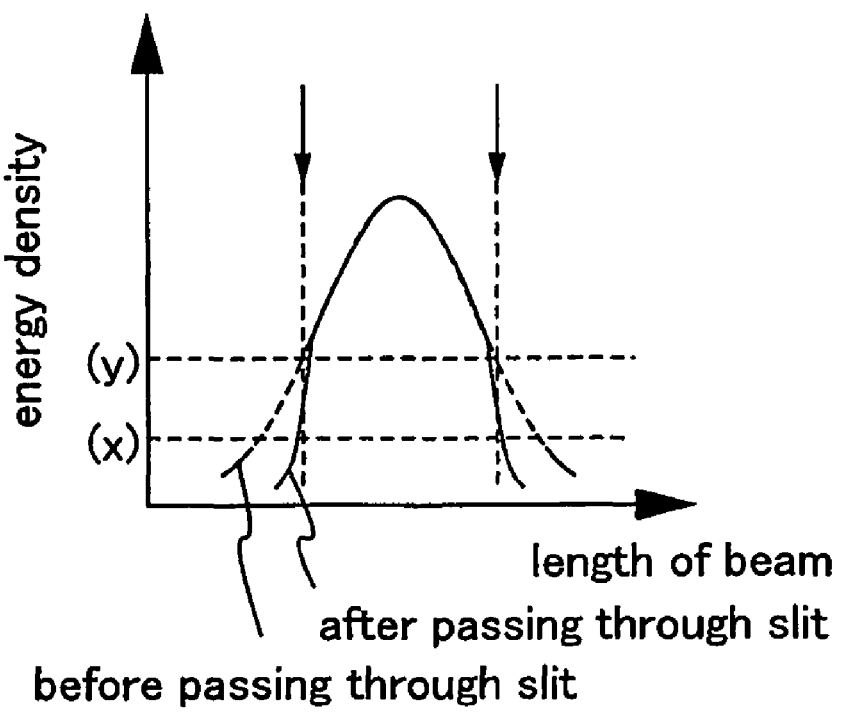

The laser beam emitted from the laser oscillator passes through the slit 102 so that a low-intensity part of the laser beam is blocked. The low-energy part of the linear or rectangular laser beam at its opposite ends can be removed by providing the slit 102 so as to act on the major-axis direction of the linear or rectangular beam. At the same time, the length of the linear or rectangular beam in the major-axis direction can be adjusted. That is to say, although the laser beam has energy density distribution shown in FIG. 2A at the emission from the oscillator, the laser beam having energy density distribution shown with a solid line in FIG. 2B is obtained by passing through the slit.

Next, the traveling direction of the laser beam is changed by the mirror 103. Although the traveling direction thereof is changed so as to be perpendicular to the substrate in this embodiment, the traveling direction thereof may also be changed so as to be oblique to the substrate.

After that, the linear or rectangular beam is formed on the irradiation surface by the cylindrical lenses 105 and 106 acting on the major-axis and minor-axis directions of the linear or rectangular beam and is delivered to the semiconductor film. In this embodiment, one of the two cylindrical lenses 105 and 106 shapes the linear or rectangular beam in the major-axis direction, and the other shapes the linear or rectangular beam in the minor-axis direction. Since the cylindrical lens has curvature in one direction, it is possible to condense or expand the laser beam in only a one-dimensional direction. Consequently, the two cylindrical lenses are set so that one of them has the generatrix line in a direction where the X-axis stage operates (hereinafter referred to as an X-axis direction) and the other has the generatrix line in a direction where the Y-axis stage operates (hereinafter referred to as a Y-axis direction). This makes it possible to change the size of the beam spot on the irradiation surface to any degree in the X-axis direction and the Y-axis direction. Therefore, the optical alignment becomes easier and the degree of freedom in the alignment increases.

The substrate 107 with the semiconductor film formed thereover is a glass substrate made of aluminoborosilicate glass, barium borosilicate glass, or the like, a quartz substrate, a ceramic substrate, a stainless steel substrate, a flexible substrate typified by a plastic substrate or an acrylic substrate, or a single-crystal semiconductor substrate (typified by an N-type or P-type single-crystal silicon substrate, a GaAs substrate, an InP substrate, a GaN substrate, a SiC substrate, or a ZnSe substrate). The substrate 107 is fixed to the suction stage 108 so as not to fall during the laser irradiation. The suction stage 108 is moved repeatedly in XY directions on a plane parallel to the surface of the semiconductor film using the X stage 109 and the Y stage 110 so as to crystallize the semiconductor film.

According to the present invention, the energy insufficiency at the opposite ends of the linear or rectangular beam can be suppressed and the width of the microcrystal region in the laser irradiation region ranges from 1 to 20 µm, thereby annealing the semiconductor film homogeneously.

Figure 23:
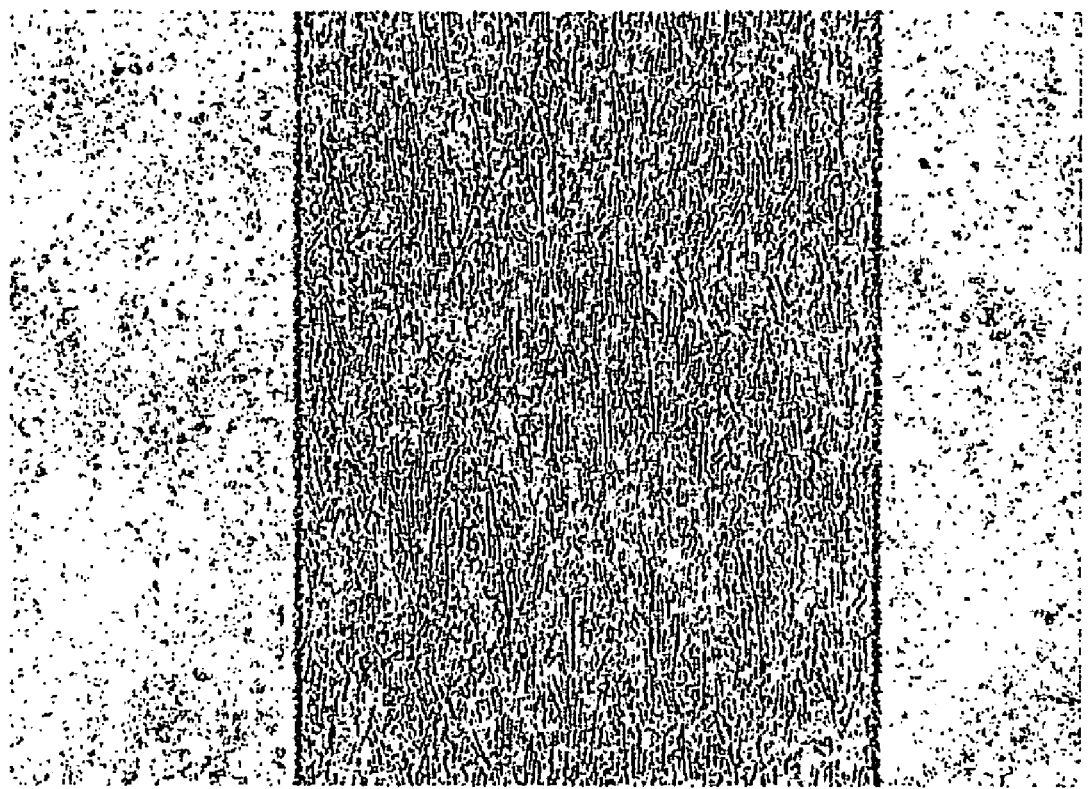
FIG. 23 is a photograph showing a surface of a semiconductor film after being irradiated with a laser beam according to the present invention.
Figure 24:
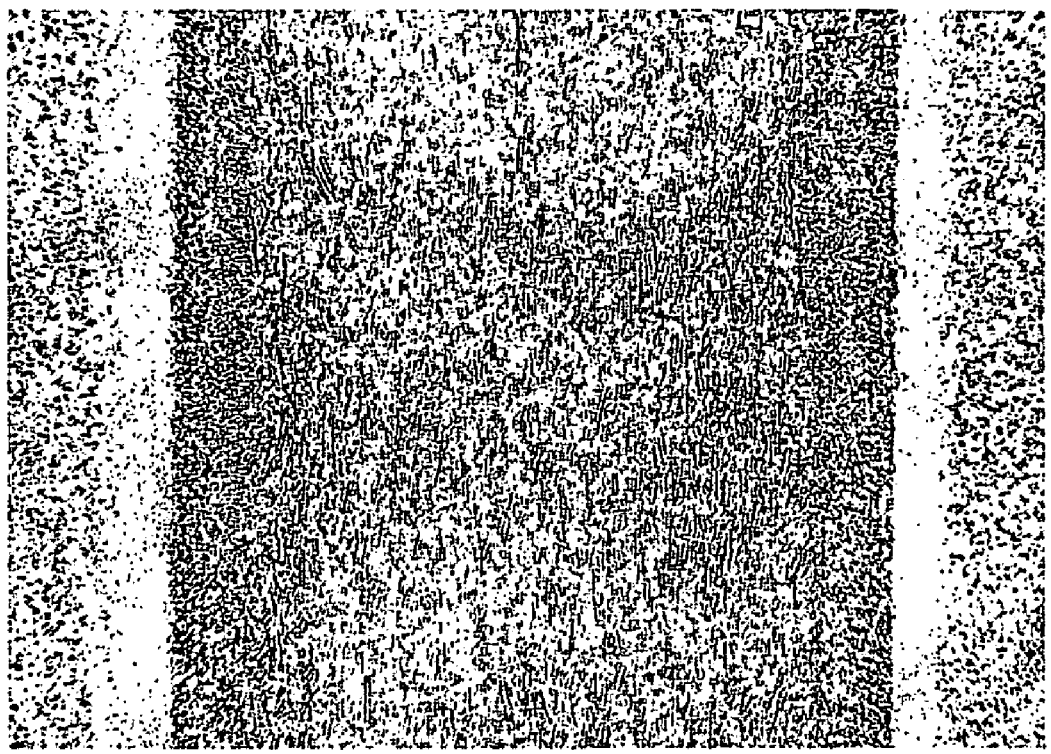
FIG. 24 is a photograph showing a surface of a semiconductor film after being irradiated with a laser beam without using a slit.
Figure 25:
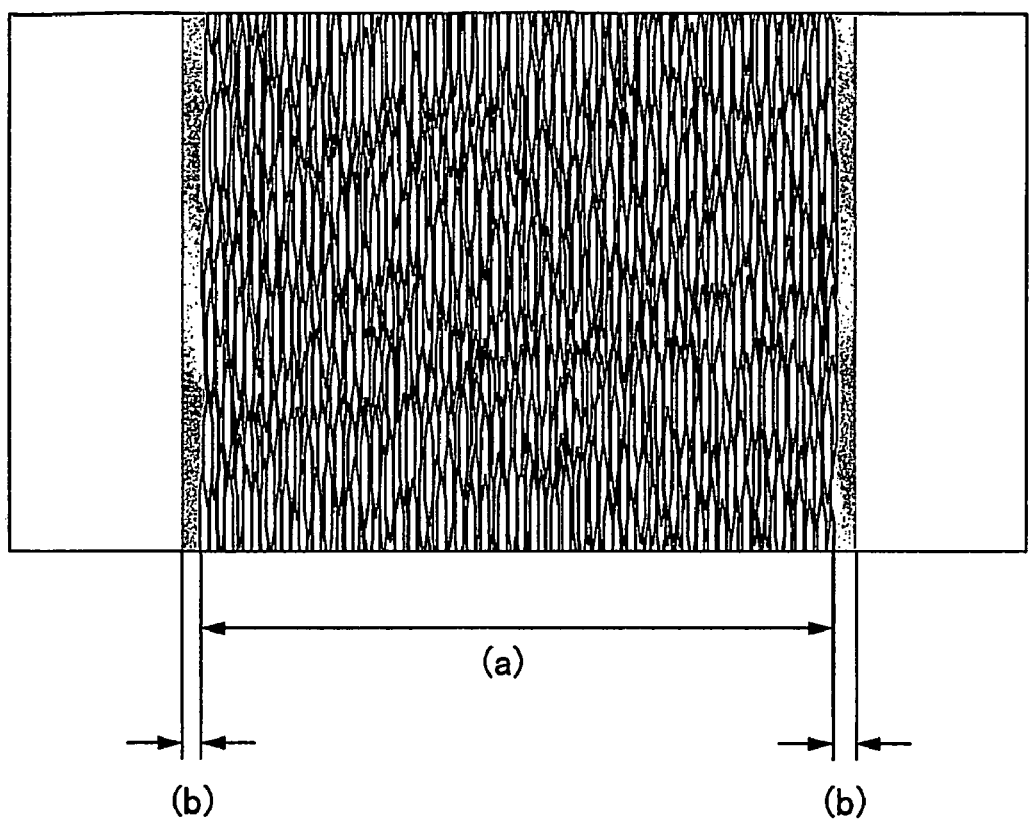
FIG. 25 is a drawing of the photograph in FIG. 23.
Figure 26:
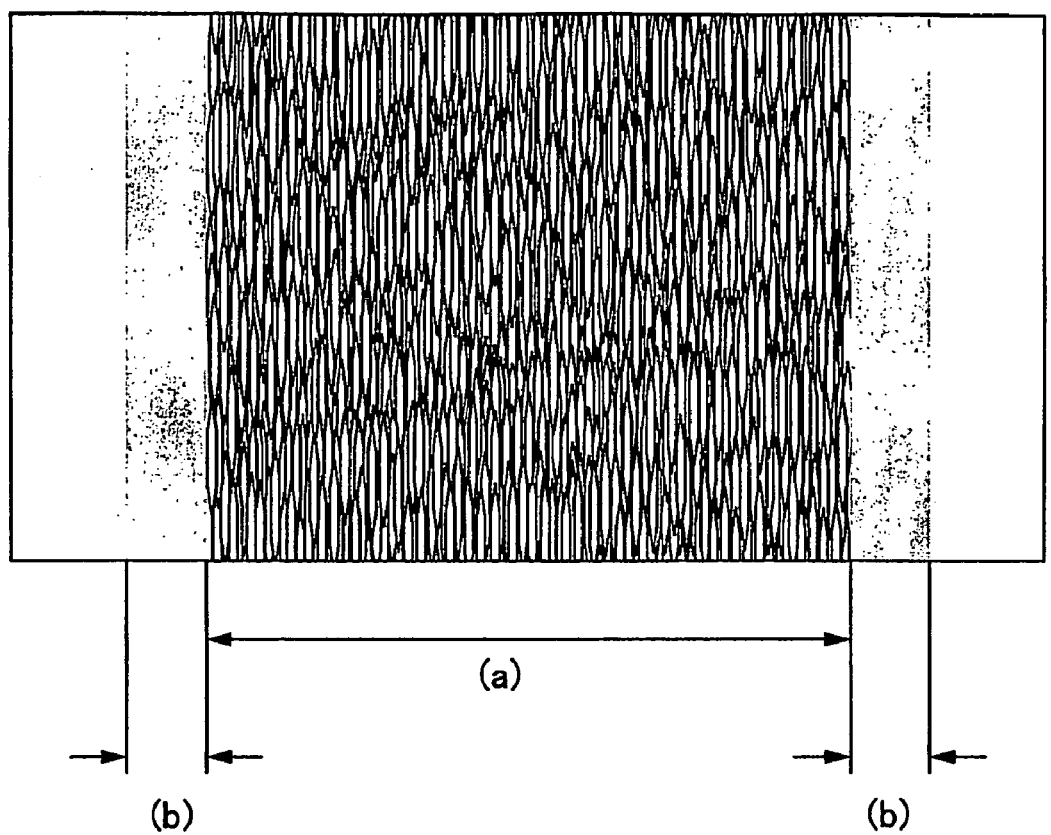
FIG. 26 is a drawing of the photograph in FIG. 24.

A state of the surface of the semiconductor film after conducting the laser irradiation by employing the present invention is compared with that without employing the present invention. FIG. 23 shows the surface of the semiconductor film when the present invention is applied, while FIG. 24 shows the surface of the semiconductor film when the laser beam is delivered without using the slit. Both figures show the top view of the semiconductor films. It is to be noted that FIGS. 25 and 26 correspond to FIGS. 23 and 24, respectively.

When the semiconductor film is irradiated with a linear or rectangular laser beam, a region irradiated with a central portion of the beam spot becomes a large crystal grain region. The large crystal grain region corresponds to a region of a homogeneous state in the center in FIG. 24 and a region (a) in FIG. 26. The large crystal grain region has a width of 210 µm. In both FIGS. 24 and 26, a crystal grain having relatively small grain diameter (a microcrystal) is formed in widths from 30 to 40 µm in regions adjacent to the opposite ends of the large crystal grain region (regions (b) in FIG. 26) respectively. In FIG. 24, the one width of the microcrystal region is estimated to 32 µm. The proportion of the width of the microcrystal region to the width of the large crystal grain region is $(32 \times 2/210) \times 100 = 30(\%)$.

In the case of using the slit, the width of the microcrystal region formed at the opposite ends of the large crystal grain region can be decreased drastically so as to be in the range of 1 to 20 µm. The advantageous effect in using the slit is higher as the length of the beam spot formed on the irradiation surface in the major-axis direction is longer. The width of the microcrystal region becomes 5% or less of that of the large crystal grain region. Moreover, in the case of FIG. 23, it has been confirmed that the width of the microcrystal region is 3% or less of that of the large crystal grain region. In FIG. 23, the large crystal grain region is formed in 210 µm wide in a region irradiated with the central portion of the beam spot (a region (a) in FIG. 25). In regions adjacent to this region (regions (b) in FIG. 25), the microcrystal is formed. The one width of the microcrystal region is estimated to 2.8 µm. The proportion of the width of the microcrystal region to the width of the large crystal grain region is $(2.8 \times /210) \times 100 = 2.6(\%)$.

Embodiment 2

In this embodiment, two CW lasers are used. After laser beams emitted from these two CW lasers are combined, the combined laser beam passes through an optical system of the present invention and is delivered.

Figure 4:
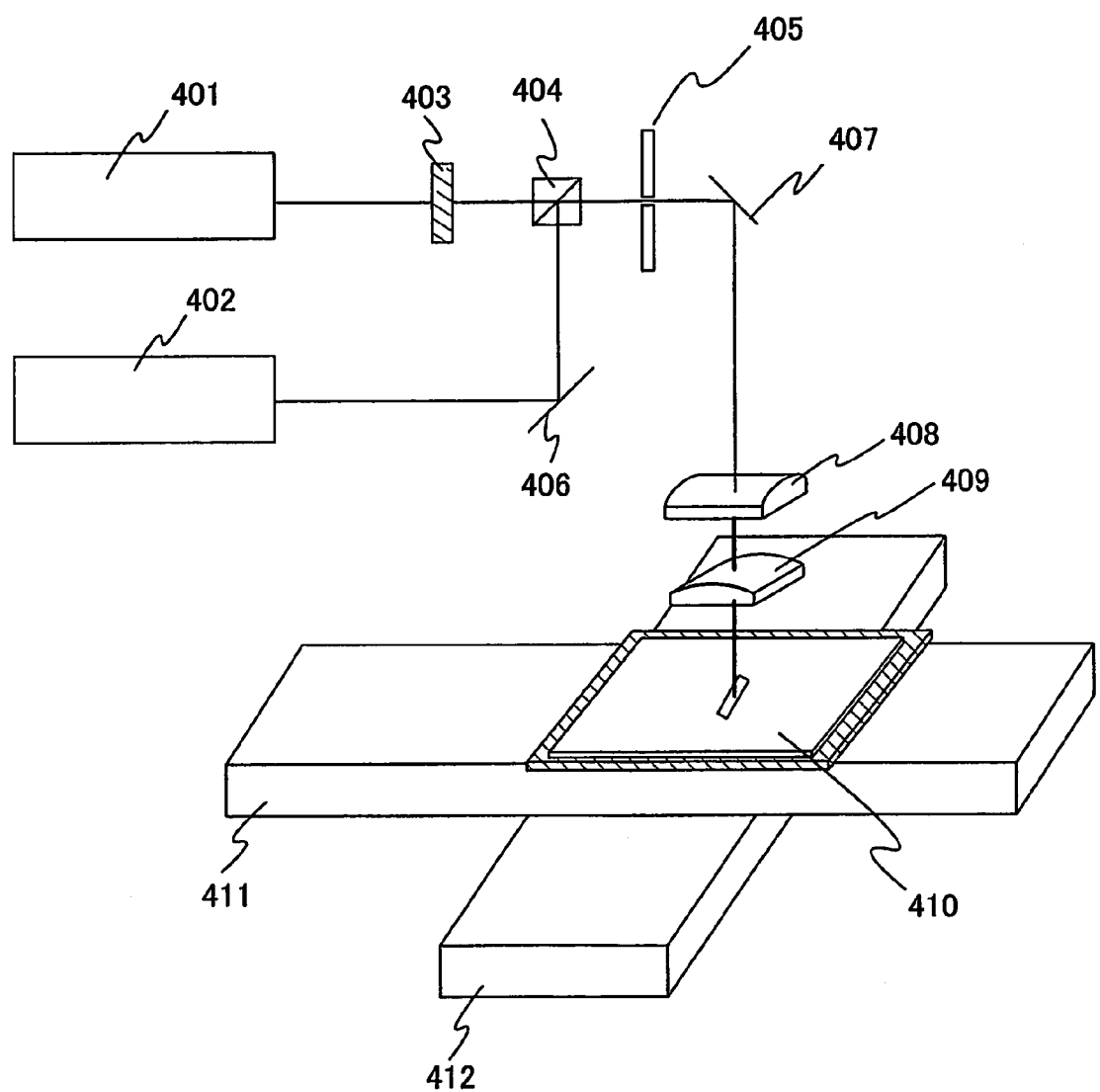
FIG. 4 schematically shows laser irradiation according to the present invention.

In FIG. 4, lasers 401 and 402 are known CW lasers. For example, a CW solid-state laser such as a laser having a medium of a single-crystal YAG, $YVO_4$, forsterite ($Mg_2SiO_4$), $YAlO_3$, or $GdVO_4$, or a poly-crystal YAG, $Y_2O_3$, $YVO_4$, $YAlO_3$, or $GdVO_4$, each of which is doped with one or a plurality of Nd, Yb, Cr, Ti, Ho, Er, Tm, and Ta as dopant, an alexandrite laser, or a Ti:sapphire laser can be used. Moreover, a CW semiconductor laser such as a GaN laser, a GaAs laser, or an InAs laser, or a CW gas laser such as an Ar laser can be used.

Laser beams emitted from the lasers 401 and 402 are converted into harmonics by a known non-linear optical element such as BBO, LBO, KTP, KDP, $LiNbO_3$, $LiIO_3$, CLBO, ATP, BIBO, or KB5. Since the semiconductor laser is pumped by emitting light by itself, the energy efficiency is higher than a solid-state laser which is pumped by using a flash lamp.

In this embodiment, the lasers 401 and 402 are CW YAG lasers. The laser beams emitted from the laser oscillators 401 and 402 are converted into the second harmonic by a non-linear optical element. The laser beams used here preferably have a wavelength of 550 nm or less and have extremely high output stability.

The laser beams are combined by using an apparatus equipped with a half-waveplate 403, a polarization beam splitter 404, a slit 405, mirrors 406 and 407, and convex cylindrical lenses 408 and 409.

When the laser beams emitted from the two lasers 401 and 402 have the same polarizing direction, the laser beams cannot be combined. Therefore, a first laser beam passes through the half-waveplate 403 so that its polarizing direction is rotated for 90°. Thus, the polarizing directions of the first and second laser beams are set independent. The second laser beam enters the polarization beam splitter using the mirror 406 or the like. Then, the first and second laser beams are combined through the polarization beam splitter 404. The combined laser beam is introduced into the slit so that a low-energy part of the laser beam is blocked. Then, the laser beam is reflected on the mirror 407. Subsequently, the combined laser beam passes through the two convex cylindrical lenses 408 and 409 so that the length of the laser beam is adjusted in the major-axis and minor-axis directions, and then the laser beam is delivered to the semiconductor film 410. When a homogenizer using a diffractive optical element, an optical waveguide, or the like is set before the slit 405, the energy distribution can be homogenized further and the shape thereof becomes rectangular when viewed from the major-axis direction.

When the laser beams emitted from the laser oscillators 401 and 402 are combined so as to form one image at the slit, actually, the combined beam that forms an image at the slit 405 is separated after passing through the slit 405 because of the alignment of the optical system. When nothing is done, the separated laser beams are not combined again. However, by passing through the two cylindrical lenses 408 and 409 or a convex spherical lens after reflecting on the mirror 407, the laser beams can be combined again to form one image on the semiconductor film 410. That is to say, the image at the slit and the image on the semiconductor film are in a conjugated relation by the two cylindrical lenses 408 and 409 or a convex spherical lens.

In order to crystallize the semiconductor film 410 over the substrate, the linear beam is moved in a direction perpendicular to the major-axis direction while being displaced by an appropriate irradiation pitch in the major-axis direction. This operation is conducted by fixing the laser oscillators and the optical system (the half-waveplate 403, the polarization beam splitter 404, the mirror 407, and the cylindrical lenses 408 and 409) and moving the substrate using the X stage 411 and the Y stage 412 so that the linear beam is moved on the substrate.

In this embodiment, a plurality of laser oscillators are used and the laser beams emitted from the plurality of laser oscillators are combined. Further, the laser crystallization is conducted after the combined laser beam passes through the optical system of the present invention in which the slit is used in combination with the two convex cylindrical lenses or a convex spherical lens.

According to the above features, a semiconductor film having a narrower microcrystal region can be manufactured. By applying the present invention, the width of the microcrystal region in the laser irradiation region can be made in the range of 1 to 20 μm.

Further, when the two laser beams are combined to conduct the laser irradiation in the direction of arrow as shown in FIG. 5A, the beam spot can be made larger than that formed by using only one laser oscillator in the direction of arrow as shown in FIG. 5B because the sum of the energy of the two laser oscillators can be given at one time to the semiconductor film 501. According to the present invention, the width of the semiconductor film 502 having the large crystal grain can be doubled.

Conventionally, the microcrystal region and the ridge are formed at the boundary between the adjacent crystallized regions; therefore, TFTs are not manufactured across the adjacent crystallized regions. However, TFTs need to be arranged in various positions due to the design. That is to say, in order to increase the degree of integration in a limited area, it is necessary to arrange TFTs across the adjacent crystallized regions. However, when TFTs are formed in this way, the crystallization states of the semiconductor films in the TFTs vary. Since the characteristic of an electronic appliance depends on one of the TFTs in the electronic circuit that has the lowest electron mobility, this portion is a bottleneck.

Figure 20:
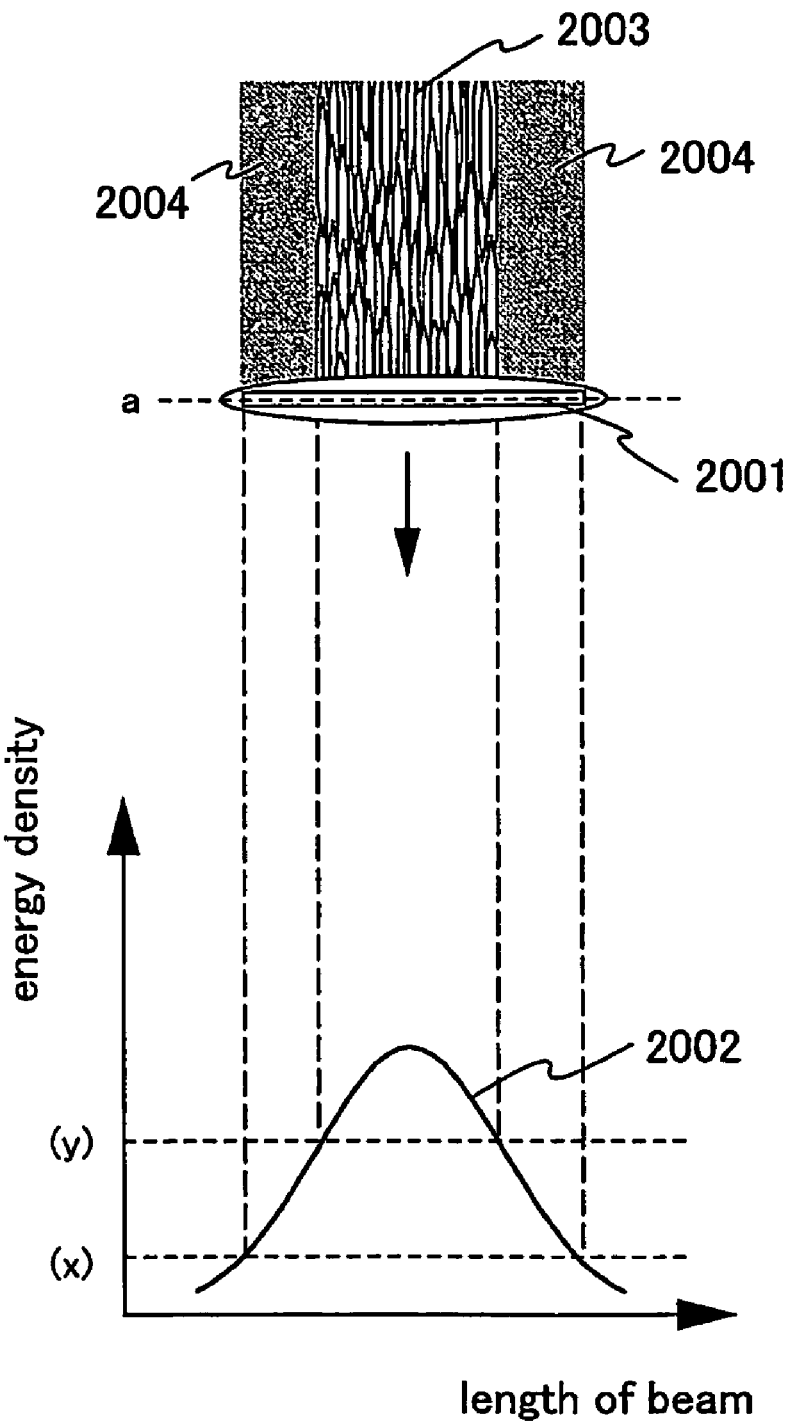
FIG. 20 shows energy density of a laser beam.
Figure 21A:
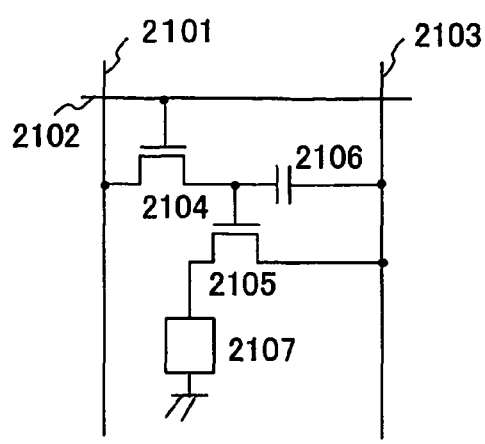
FIGS. 21A to 21C schematically show an embodiment of the present invention.
Figure 21B:
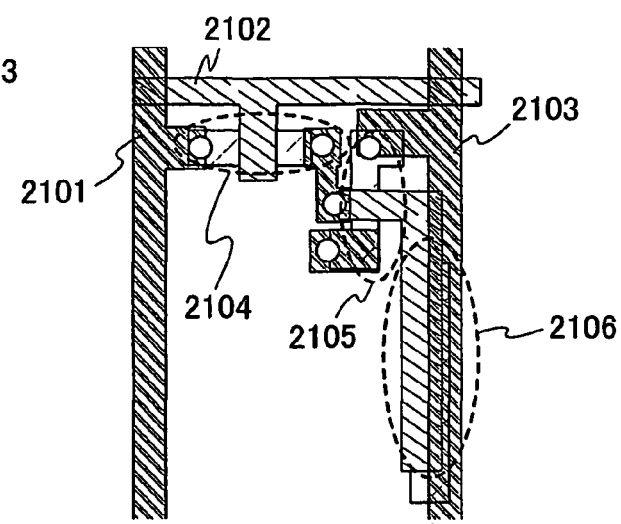
Figure 21C:
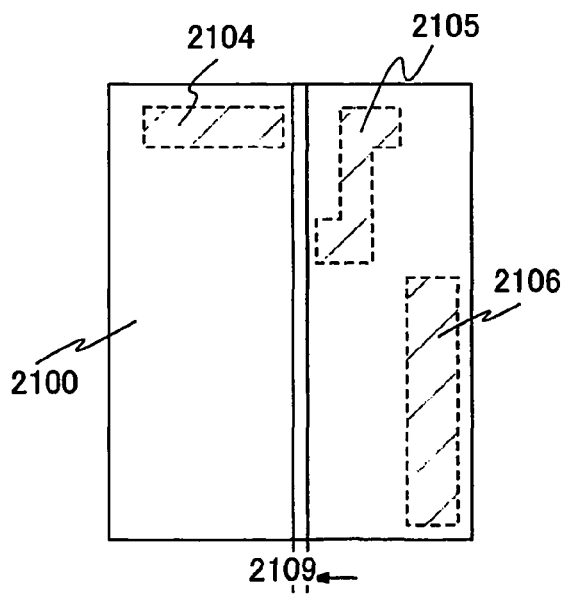

FIGS. 21A to 21C show an example of a layout of TFTs after conducting the laser irradiation. Specifically, a layout of TFT for a pixel of a light-emitting element is shown. A reference numeral 2100 denotes a semiconductor layer; 2101, a source signal line; 2102, a gate signal line; 2103, a current supplying line; 2104, a switching TFT; 2105, a driver TFT; 2106, a capacitor; and 2107, a light-emitting element. A part denoted with a reference numeral 2201 in FIG. 22 corresponds to the region irradiated with the end portion 2004 (the microcrystal region) in FIG. 20.

Figure 22:
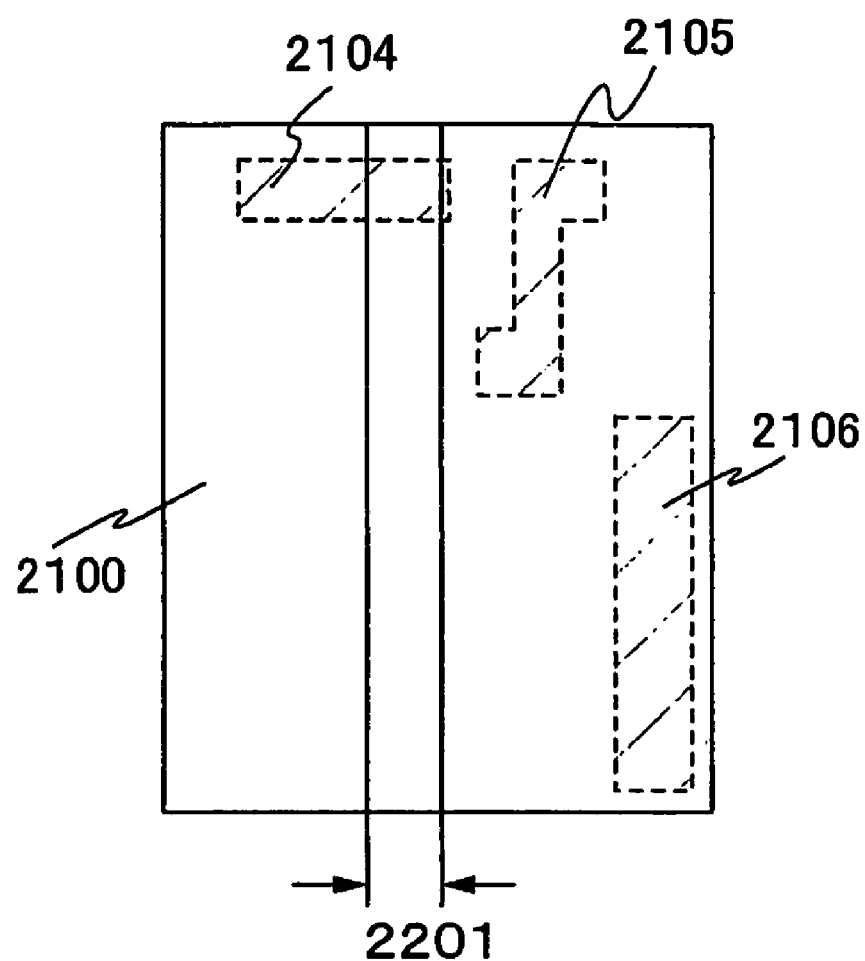
FIG. 22 shows a comparative example to the present invention.

Conventionally, the TFTs need to be formed even in the microcrystal region 2201 in FIG. 22; however, the width of the microcrystal region 2109 in the laser irradiation region can be decreased to be in the range of 1 to 20 μm as shown in FIG. 21C by conducting the laser irradiation of the present invention. Therefore, the degree of freedom in arranging the TFTs increases. In particular, by applying the method described in this embodiment, the laser irradiation region has a width of 500 μm, which allows freer layout of the TFTs.

By conducting the laser irradiation as shown in this embodiment, the degree of freedom in arranging the TFTs increases. By forming a wiring in the microcrystal region 2109 formed thus, the semiconductor device can be made more compact, occupy a smaller area, and the yield can be increased as compared with the case of using one laser oscillator in the laser irradiation.

Although this embodiment shows an example of using the two CW lasers, a femtosecond laser or a pulsed laser having a repetition rate of 10 MHz or more described in Embodiment Mode or another Embodiment may also be used.

This embodiment can be freely combined with Embodiment Mode and another Embodiment.

Embodiment 3

This embodiment describes an example of manufacturing a peelable dual-gate TFT with the use of a semiconductor film crystallized by using a laser irradiation apparatus of the present invention.

Figure 6A:
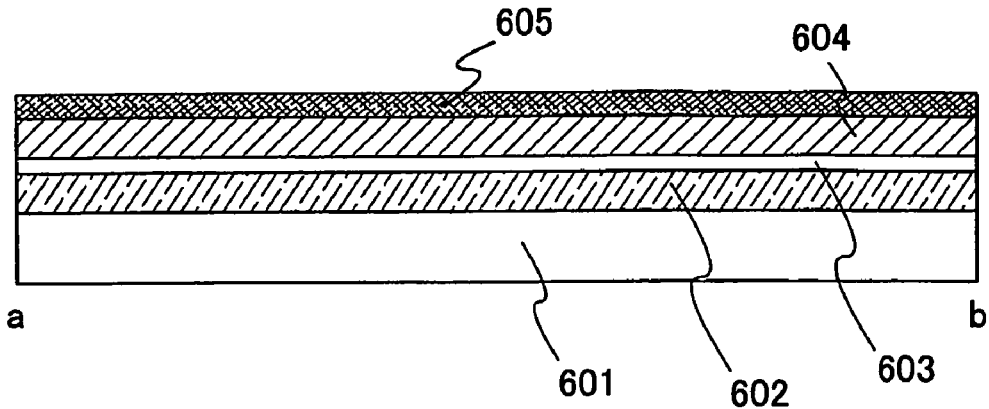
FIGS. 6A to 6C schematically show a process for manufacturing a TFT with the use of laser irradiation according to the present invention.

As shown in FIG. 6A, a metal film 602, an oxide film containing a metal element in the metal film 602 (this oxide film is hereinafter referred to as a metal oxide film 603), and a silicon oxide film 604 are formed in order over a first substrate 601 having an insulating surface. The first substrate 601 may be any substrate as long as the substrate can resist the following steps. For example, a glass substrate, a quartz substrate, a ceramic substrate, a silicon substrate, a metal substrate, or a stainless steel substrate can be used.

In this embodiment, W (tungsten) is used for the metal film 602. Alternatively, the metal film 602 can be formed with metal selected from Ti, Ta, Mo, Nd, Ni, Co, Zr, Zn, Ru, Rh, Pd, Os, and Ir, an alloy material containing any one of these elements as its main component, or a compound material of any one of these elements with oxygen, nitrogen, or the like, in a single-layer or multilayer structure. The metal film 602 may be formed by, for example, a sputtering method using a metal target. The thickness of the metal film 602 may be set to 10 to 200 nm, preferably 50 to 75 nm.

Instead of the metal film 602, a film of nitride of the above metal (for example, tungsten nitride or molybdenum nitride) may be used. Further, instead of the metal film 602, an alloy film of the above metal (for example, W—Mo alloy: $W_x Mo_{1-x}$) may be used. In this case, the alloy film can be formed by a sputtering method using a plurality of targets of first metal (W) and second metal (Mo) or a target of alloy of the first metal (W) and the second metal (Mo) in a film-forming chamber.

Furthermore, nitrogen or oxygen may be added into the metal film 602. As a method for adding nitrogen or oxygen, ions of nitrogen or oxygen may be implanted into the metal film, or the metal film 602 may be formed by a sputtering method in a film-forming chamber filled with a nitrogen or oxygen atmosphere. Alternatively, metal nitride may be used as a target.

After forming the metal film 602, the metal oxide film 603 is formed. Specifically, the metal oxide film 603 is formed by thermally oxidizing the surface of the metal film 602 or by a sputtering method or the like. In this embodiment, since the metal film 602 is formed with tungsten, the metal oxide film 603 is formed with an oxide film having tungsten ($WO_x$ (x=2 to 3)).

Next, a conductive film 605 to be an electrode serving as a gate electrode later in a lower part of a TFT (the electrode is hereinafter referred to as a lower electrode 600) is formed over the silicon oxide film 604. The conductive film 605 can be formed with a poly-crystalline semiconductor doped with metal or impurity having one conductivity type. In the case of using metal, tungsten (W), molybdenum (Mo), titanium (Ti), tantalum (Ta), aluminum (Al), or the like can be used. In this embodiment, the conductive film 605 is formed with tungsten in 50 nm thick. The thickness of the conductive film 605 may range from 20 to 50 nm.

Figure 6B:
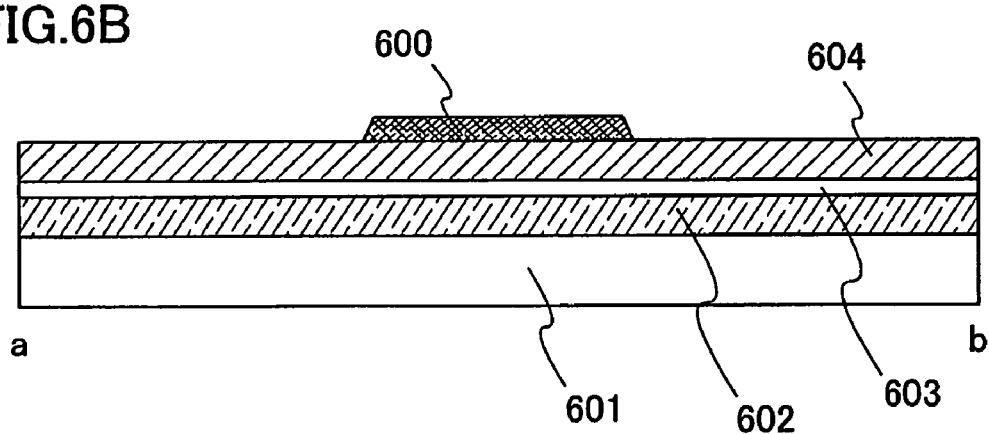

After that, the lower electrode 600 is formed by etching with the use of a mask (for example a resist mask) (FIG. 6B). For example, the resist mask can be narrowed by applying oxygen plasma. When the etching is conducted after such a process, the lower electrode 600 to be the gate electrode can be tapered.

The lower electrode 600 can be directly formed by a printing method or a droplet-discharging method typified by an ink-jet method which can discharge a material to the predetermined location. With this method, the lower electrode 600 can be formed without using the mask.

Figure 6C:
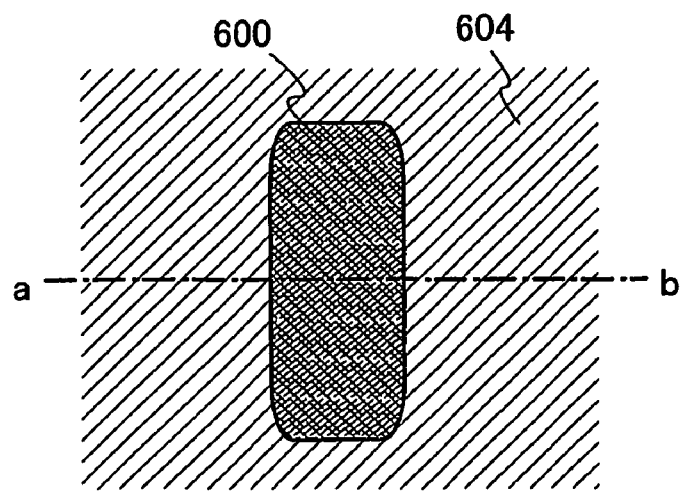

FIG. 6C shows a top view of the lower electrode 600, and FIG. 6B corresponds to a cross-sectional view taken along a-b in FIG. 6C.

Figure 7A:
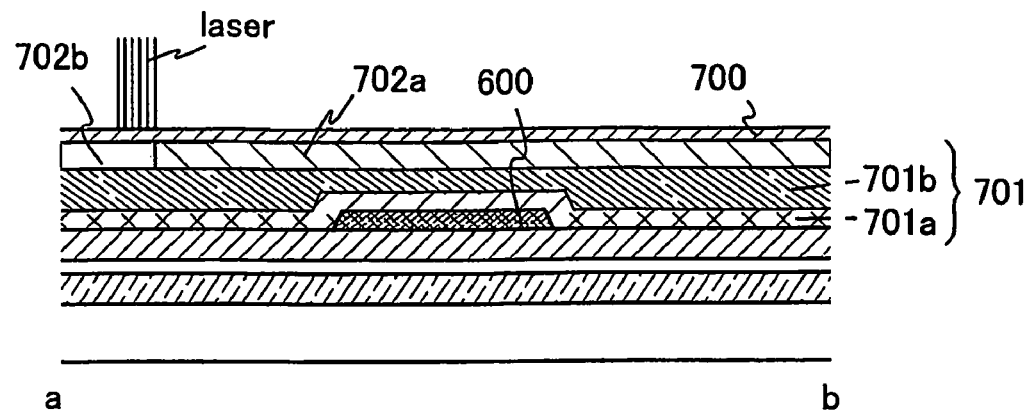
FIGS. 7A to 7C schematically show a process for manufacturing a TFT with the use of laser irradiation according to the present invention.

Next, as shown in FIG. 7A, a first gate insulating film 701 is formed. The first gate insulating film 701 contains at least oxygen or nitrogen. In this embodiment, a silicon nitride oxide film ($SiN_xO_y$) (x>y) (x, y=1, 2 . . . ) 701a is formed in 50 nm thick and a silicon oxynitride film ($SiO_xN_y$) (x>y) (x, y=1, 2 . . . ) 701b is formed in 100 nm thick. However, the order of stacking the films and the film thicknesses are not limited to this.

Next, a non-single crystal semiconductor film 702a is formed. The non-single crystal semiconductor film 702a is formed by a low-pressure thermal CVD method, a plasma CVD method, a sputtering method, or the like. Further, the non-single crystal semiconductor film 702a may be formed by using silane ($SiH_4$) as a material.

Next, an insulating film 700 is formed so as to cover the non-single crystal semiconductor film 702a. In this embodiment, a silicon oxide film is formed. Alternatively, a silicon nitride oxide film or a silicon nitride film can be used as the material of the insulating film 700. In this embodiment, the insulating film 700 is formed with silicon oxide in 300 nm thick by a sputtering method. The silicon oxide film formed here serves to press the semiconductor film physically so as to prevent the semiconductor film from peeling due to the laser irradiation.

Next, laser irradiation is conducted using a laser irradiation apparatus of the present invention to crystallize the non-single crystal semiconductor film 702a, thereby forming a crystalline semiconductor film 702b. By conducting the laser irradiation using the laser irradiation apparatus of the present invention, the width of the microcrystal region in the laser irradiation region can be decreased to be in the range of 1 to 20 µm. For this reason, TFTs formed using this semiconductor film have superior and homogeneous characteristics. Moreover, since the restriction on the layout and the size decreases very much, the design rule in manufacturing semiconductor devices is drastically relaxed. By forming wirings in the microcrystal region, further space-saving and increase in the yield of a semiconductor device can be achieved. Since the region inapplicable to the semiconductor device decreases drastically by applying the present invention, the yield can be increased and the cost can be reduced.

After that, the insulating film 700 over the crystalline semiconductor film 702b is removed and a second gate insulating film 703 is formed. The second gate insulating film 703 may be formed with an insulating film containing at least oxygen or nitrogen in the same way as the first gate insulating film 701. In this embodiment, a silicon nitride oxide film ($SiN_xO_y$) (x>y) (x, y=1, 2 . . . ) is formed in 40 nm thick.

Next, a second conductive film 707 to be an electrode serving as a gate electrode later in an upper part of a TFT (this electrode is hereinafter referred to as an upper electrode 704) is formed thereover. The second conductive film 707 only needs to be a film having conductivity as same as the lower electrode 600. In this embodiment, a multilayer film containing W (tungsten) and TaN (tantalum nitride) is used.

In order to pattern the second conductive film 707 into a predetermined shape, a mask, for example a resist mask, is formed all over the second conductive film 707. Next, rear-side light exposure is conducted using the lower electrode 600 as a mask, thereby forming a resist mask 705. With the use of the resist mask 705, the second conductive film 707 is patterned so as to form the upper electrode 704.

As another method, a printing method or a droplet-discharging method typified by an ink-jet method which can discharge a material to a predetermined location can be employed to form the upper electrode 704 directly.

Figure 7B:
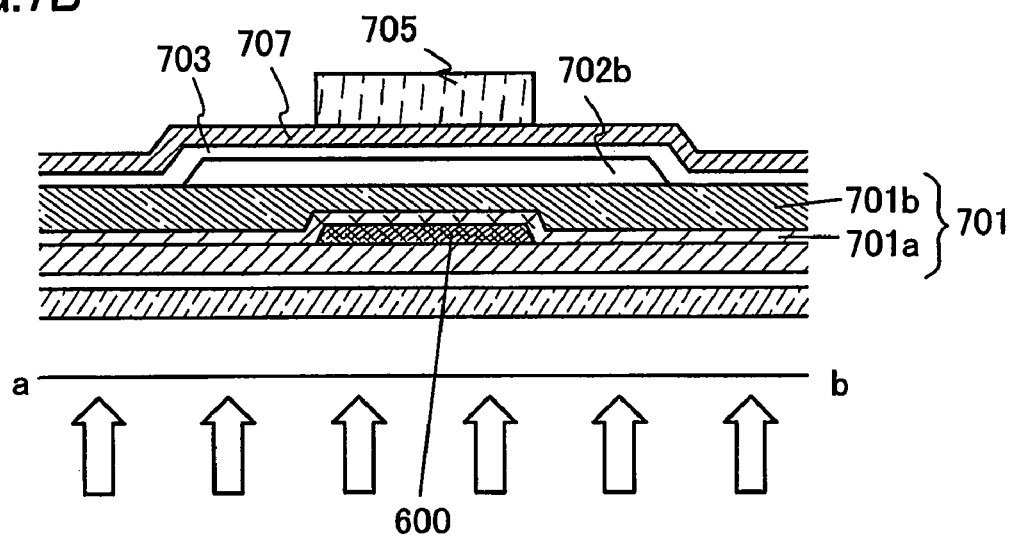
Figure 7C:
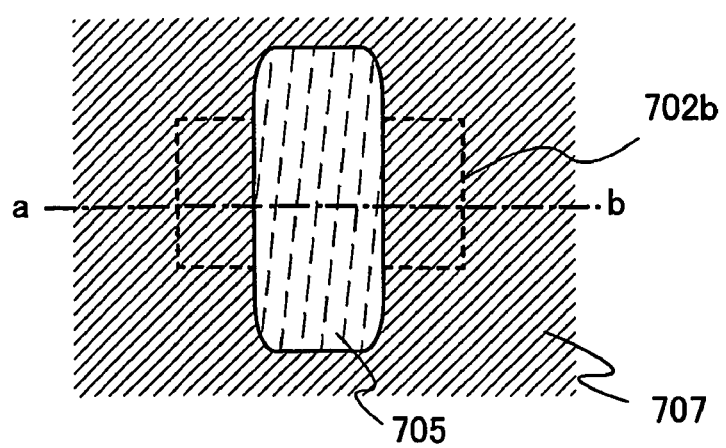

FIG. 7C shows a top view in which the resist mask 705 is provided over the second conductive film 707, while FIG. 7B shows a cross-sectional view taken along a-b in FIG. 7C.

Figure 8A:
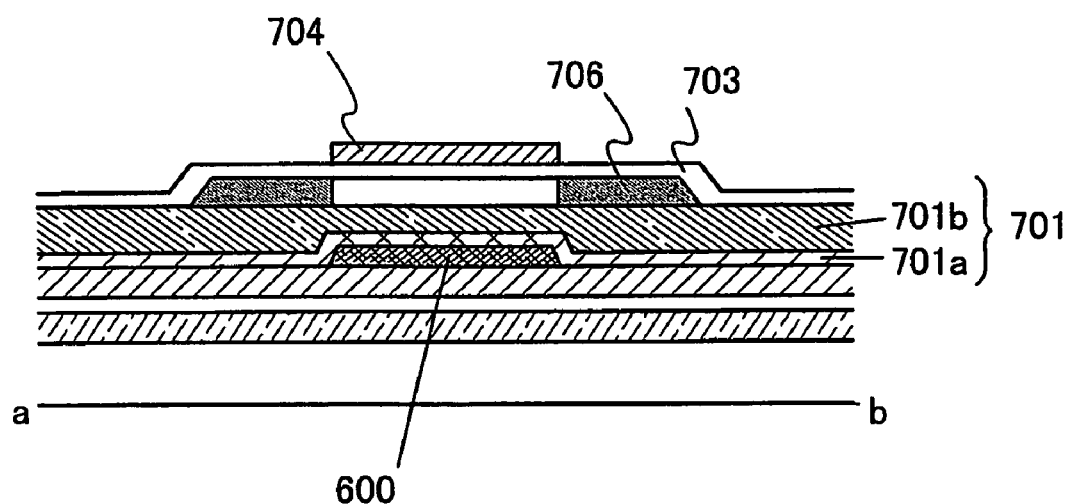
FIGS. 8A and 8B schematically show a process for manufacturing a TFT with the use of laser irradiation according to the present invention.

After that, the crystalline semiconductor film 702b is doped with an impurity element using the patterned upper electrode 704 as a mask, thereby forming an impurity region 706 as shown in FIG. 8A.

Then, wirings are provided in order to control the lower electrode 600 and the upper electrode 704 individually. Here, a part of the upper electrode 704 is removed in order to provide a contact hole to connect the lower electrode 600 with the wiring. At this time, a mask, for example a resist mask, may be formed over the upper electrode 704 and a part of the upper electrode 704 may be etched.

Figure 8B:
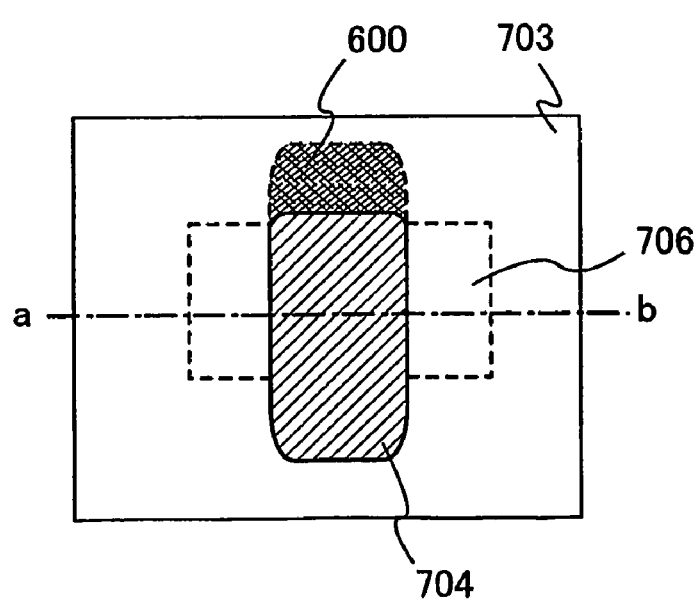

FIG. 8B shows a top view in which a part of the upper electrode 704 has been etched, and FIG. 8A shows a cross-sectional view taken along a-b in FIG. 8B.

In the case of controlling the lower electrode 600 and the upper electrode 704 in the same way, a part of the upper electrode 704 is not necessarily removed. In this case, the contact hole is formed in the first gate insulating film 701 provided over the lower electrode 600 and the upper electrode 704 is formed in this contact hole, thereby connecting the lower electrode 600 and the upper electrode 704.

Figure 9A:
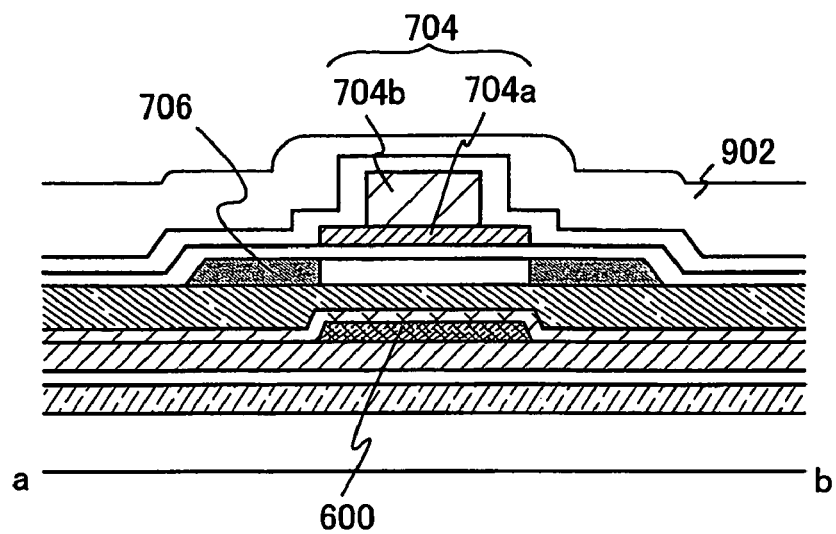
FIGS. 9A to 9C schematically show a process for manufacturing a TFT with the use of laser irradiation according to the present invention.

Further, as shown in FIG. 9A, a conductive film 704b may be formed over the conductive film 704a, thereby forming the upper electrode 704 with a conductive film including a plurality of layers. In this embodiment, the conductive film 704b may be patterned into a predetermined shape using a mask, for example a resist mask, or may be directly formed by a printing method or a droplet-discharging method typified by an ink-jet method which can discharge a material at a predetermined location. Then, an impurity element may be doped with the conductive film 704b provided. At this time, a low-concentration impurity region (LDD region) 900 can be formed so as to overlap the conductive film 704a.

After that, an insulating film 901 is formed so as to cover the upper electrode 704 (that is, the conductive films 704a and 704b). The insulating film 901 can be formed with an insulating film containing at least nitrogen or oxygen such as silicon oxide ($SiO_x$), silicon nitride ($SiN_x$), silicon oxynitride ($SiO_xN_y$) (x>y), or silicon nitride oxide ($SiN_xO_y$) (x>y) (x, y=1, 2 . . . ). In this embodiment, silicon oxynitride is used. In particular, the insulating film 901 can contain much hydrogen by forming the insulating film 901 according to a plasma CVD method. Containing hydrogen is preferable because the hydrogen can decrease dangling bonds in the semiconductor film 702b. For this reason, heat treatment is preferably conducted with the insulating film 901 provided.

Next, the flatness can be improved by forming an interlayer insulating film 902 so as to cover the insulating film 901. Such an interlayer insulating film 902 can be formed with an organic material or an inorganic material. The organic material is, for example, polyimide, acrylic, polyamide, polyimide-amide, resist, benzocyclobutene, siloxane, or the like. Siloxane is a material which has a bond of silicon and oxygen expressed with —Si—O—Si— (siloxane bond) as a basic unit and has a structure in which silicon is combined with fluorine, aliphatic carbon hydride, aromatic carbon hydride, or the like. The inorganic material is, for example, an insulating film containing at least oxygen or nitrogen such as silicon oxide ($SiO_x$), silicon nitride ($SiN_x$), silicon oxynitride ($SiO_xN_y$) (x>y), or silicon nitride oxide ($SiN_xO_y$) (x>y) (x, y=1, 2 . . . ). As the material for the interlayer insulating film 902, polysilazane (an inorganic polymer which has a structure of —($SiH_2NH$)— as a basic unit and forms a ceramic insulator by heat) can be used. Moreover, a complex of polysilazane and an organic material may be used as the interlayer insulating film 902.

The interlayer insulating film 902 may be a multilayer of these insulating films. In particular, if the insulating film is formed with the organic material, the flatness is enhanced; however, moisture or oxygen is absorbed by the organic material. In order to prevent this, an insulating film formed with an inorganic material is preferably formed over the insulating film formed with the organic material. When an insulating film having nitrogen in an inorganic material is used, the intrusion of alkali ions such as Na can be prevented.

Heat treatment after forming the insulating film 901 may be conducted after forming the interlayer insulating film 902.

After that, a contact hole is formed in the interlayer insulating film 902, the insulating film 901, and the second gate insulating film 703, and then a wiring 903 to connect with the impurity region 706 is formed.

Moreover, an insulating film serving as a protective film may be formed over the wiring 903. Such an insulating film can be formed with an insulating film containing at least oxygen or nitrogen such as silicon oxide ($SiO_x$), silicon nitride ($SiN_x$), silicon oxynitride ($SiO_xN_y$) (x>y), or silicon nitride oxide ($SiN_xO_y$) (x>y) (x, y=1, 2 . . . ). It is particularly preferable to use an insulating film containing nitrogen in order to prevent the intrusion of the impurity element.

Figure 9B:
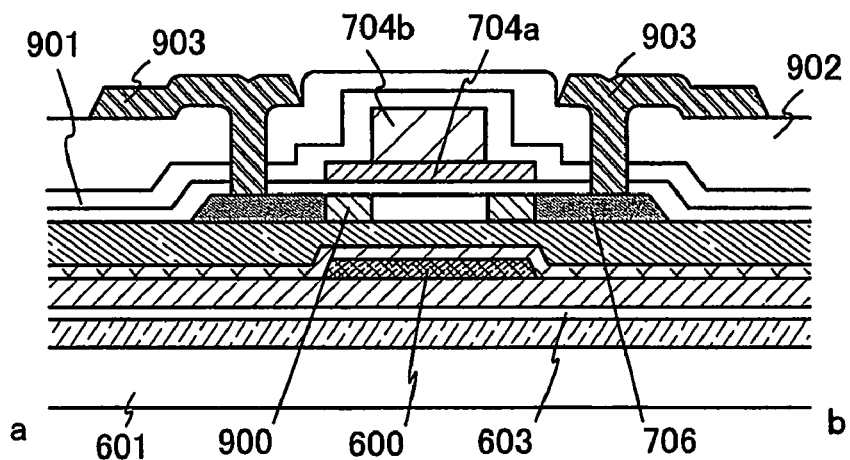
Figure 9C:
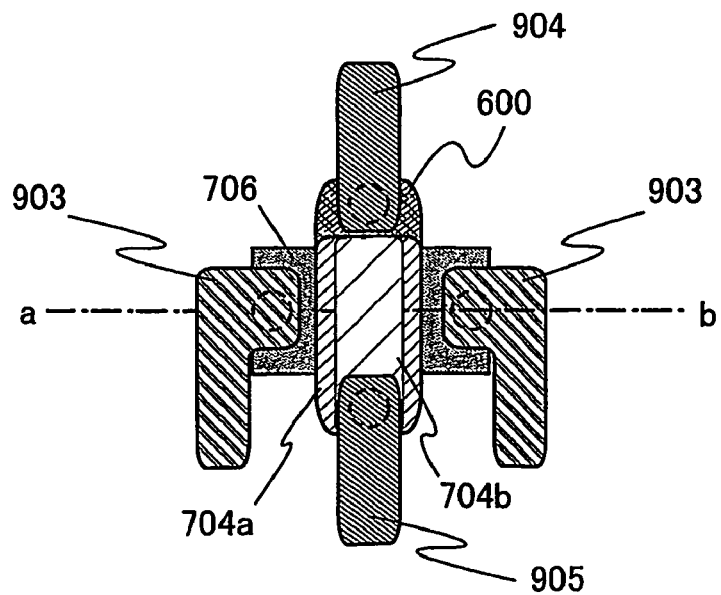

FIG. 9C shows a top view of a wiring 904 connected to the lower electrode 600 and a wiring 905 connected to the upper electrode 704 (the conductive films 704a and 704b). A cross-sectional view taken along a-b in FIG. 9C corresponds to FIG. 9B.

In this way, a dual-gate TFT having the lower electrode 600 and the upper electrode 704 (the conductive films 704a and 704b) can be formed. The lower electrode 600 of the dual gate TFT has a feature that the lower electrode 600 and the upper electrode 704 can be separately controlled.

In the case of manufacturing a microscopic TFT, it is necessary to decrease the physical film thickness of the gate insulating film with the decrease in size of the TFT. However, when the film is too thin, the current flows even when a signal for turning off is inputted into the upper electrode 704, thereby interrupting the low power consumption. At this time, the off-state can be obtained correctly by controlling the lower electrode 600. Accordingly, the low power consumption can be achieved. Further, the lower electrode 600 can also control the threshold voltage (Vth).

In addition, in the dual-gate TFT shown in this embodiment, a capacitor can be formed with a lower gate electrode and a semiconductor layer by sandwiching an insulating layer therebetween.

TFTs manufactured according to the above process can be pasted to another substrate, for example a flexible substrate, via adhesion means after peeling at the metal oxide film 603. The substrate 601 after being peeled can be reused.

Embodiment 4

This embodiment describes an example of manufacturing various TFTs over the same substrate using a laser irradiation apparatus and a laser irradiation method according to the present invention.

Figure 10A:
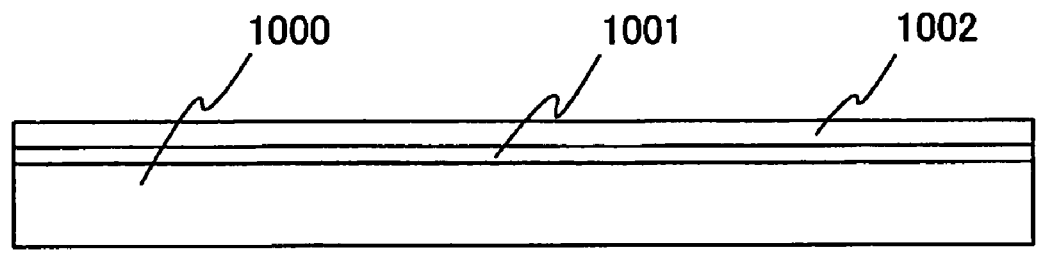
FIGS. 10A to 10C schematically show a process for manufacturing a TFT with the use of laser irradiation according to the present invention.

A base film 1001 is formed over a substrate 1000 having an insulating surface as shown in FIG. 10A. In this embodiment, a glass substrate is used as the substrate 1000. As the substrate used in this embodiment, a glass substrate made of barium borosilicate glass, aluminoborosilicate glass, or the like, a quartz substrate, a ceramic substrate, a stainless steel substrate, or the like can be used. Although a substrate made of a flexible material typified by plastic or acrylic tends to have lower resistance against heat than the other substrates, the substrate made of a flexible material can be used as long as the substrate can resist the treatment of this step.

The base film 1001 is provided in order to prevent the diffusion of alkali-earth metal or alkali metal such as Na from the substrate 1000 into the semiconductor. Alkali-earth metal and alkali metal cause adverse effects on the characteristic of a semiconductor element when such metal is in the semiconductor. For this reason, the base insulating film 1001 is formed with an insulating film which can prevent the diffusion of alkali-earth metal and alkali metal into the semiconductor, such as silicon oxide, silicon nitride, or silicon nitride oxide. The base insulating film 1001 is formed either in a single-layer or multilayer structure. In this embodiment, a silicon nitride oxide film is formed in thicknesses from 10 to 400 nm by a plasma CVD (Chemical Vapor Deposition) method.

It is effective to provide the base film in order to prevent the diffusion of the impurity when the substrate 1000 contains even a little amount of alkali-earth metal or alkali metal, such as a glass substrate or a plastic substrate. However, when the substrate 1000 in which the diffusion of the impurity does not lead to a significant problem, for example a quartz substrate, is used, the base film 1001 is not necessarily provided.

Next, a non-single crystal semiconductor film 1002 is formed over the base film 1001. The non-single crystal semiconductor film 1002 is formed in 25 to 100 nm thick (preferably 30 to 60 nm thick) by a known method (a sputtering method, an LPCVD method, a plasma CVD method, or the like). The non-single crystal semiconductor film 1002 can be formed with silicon, silicon germanium, or the like. In this embodiment, silicon is used. In the case of using silicon germanium, the concentration of germanium is preferably approximately 0.01 to 4.5 atomic %.

Figure 10B:
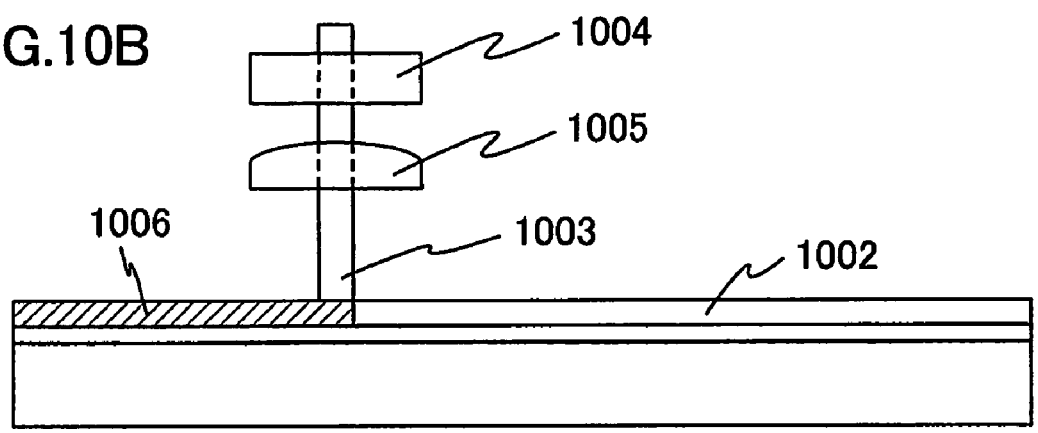

Subsequently, as shown in FIG. 10B, the non-single crystal semiconductor film 1002 is irradiated with a laser beam 1003 by using a laser irradiation apparatus according to the present invention. In this embodiment, the laser beam 1003 is emitted from a Nd:YVO$_4$ laser that provides 10 W at the second harmonic with TEM$_{00}$ mode (single transverse mode) and passes through cylindrical lenses 1004 and 1005.

Not only the above-mentioned laser but also the following laser can be employed; a CW laser oscillator, a laser oscillator emitting a laser beam with a pulse width of femtoseconds (1 femtosecond=10$^{-15}$ second) (also referred to as a femtosecond laser), or a pulsed laser oscillator having a repetition rate of 10 MHz or more.

The applicable CW laser oscillator is, for example, a solid-state laser such as a YAG laser, a YVO$_4$ laser, a YLF laser, a YAlO$_3$ laser, a GdVO$_4$ laser, or a Y$_2$O$_3$ laser; a gas laser such as an Ar laser; or a semiconductor laser such as a GaN laser, a GaAs laser, or an InAs laser. The applicable femtosecond laser is, for example, a Yb:YAG laser, a Ti:sapphire laser, or a laser using a chromium.forsterite crystal. The applicable pulsed laser with a repetition rate of 10 MHz or more is, for example, a laser having a medium of a single-crystal YAG, YVO$_4$, forsterite (Mg$_2$SiO$_4$), YAlO$_3$, or GdVO$_4$, or a polycrystal (ceramic)YAG; Y$_2$O$_3$, YVO$_4$, YAlO$_3$, or GdVO$_4$, each of which is doped with one or a plurality of Nd, Yb, Cr, Ti, Ho, Er, Tm, and Ta as dopant; an Ar ion laser; or a Ti:sapphire laser.

The laser beam 1003 is converted into a harmonic as necessary using a known non-linear optical element such as BBO, LBO, KTP, KDP, LiNbO$_3$, LiIO$_3$, CLBO, ATP, BIBO, or KB5. Although the laser beam 1003 is converted into a second harmonic by such a non-linear optical element, the laser beam 1003 may be converted into a harmonic other than the second harmonic. Since the semiconductor laser is pumped by emitting light by itself, the energy efficiency is high.

According to the laser irradiation apparatus and the laser irradiation method of the present invention, in addition to that crystal grains grown continuously in the scanning direction are formed, the width of the microcrystal region can be decreased to be in the range of 1 to 20 μm at the boundary between the adjacent laser irradiation regions. By forming the wiring in the microcrystal region, the space can be used efficiently, thereby contributing the miniaturization of the semiconductor device.

With the slit, a low-intensity part of the laser beam can be blocked. Therefore, a linear or rectangular laser beam having predetermined intensity or higher can be delivered homogeneously. This makes it possible to manufacture TFTs having superior performance and having no variation depending on the respective TFTs and to manufacture electronic appliances having superior performance and having no variation by using these TFTs.

Figure 10C:
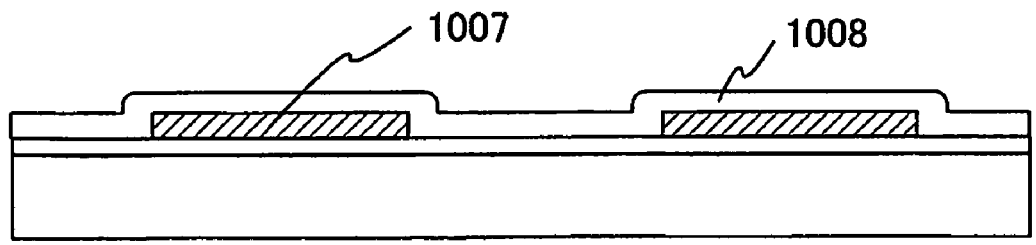

After that, as shown in FIG. 10C, a crystalline semiconductor film 1006 formed by the laser irradiation is patterned, thereby forming island-shaped semiconductor films 1007. Moreover, a gate insulating film 1008 is formed so as to cover the island-shaped semiconductor films 1007. The gate insulating film 1008 is formed with silicon oxide, silicon nitride, silicon nitride oxide, or the like by a plasma CVD method or a sputtering method. Here, a silicon nitride oxide film is formed in 115 nm thick by a plasma CVD method. In the case of a TFT having a channel length of 1 μm or less (hereinafter referred to as a submicron TFT), the gate insulating film is preferably formed in thicknesses from 10 to 50 nm.

Here, four kinds of TFTs are manufactured over the same substrate; (a) an N-channel TFT (including an LDD region), (b) a capacitor element, (c) an N-channel TFT (single drain), and (d) a P-channel TFT (single drain).

First, as shown in FIG. 11, a resist 1101 is formed in portions (a), (c), and (d) so as to cover the gate insulating film. Then, an impurity element imparting N-type conductivity is added to only the capacitor (b). As the impurity imparting the N-type conductivity, P (phosphorus), As (arsenic), or the like is given.

Next, as shown in FIG. 11B, the resist 1101 formed in the portions (a), (c), and (d) is removed, and then a conductive film 1102 to become a gate electrode is formed all over the surface. In this embodiment, TaN (tantalum nitride) is formed as a first conductive film 1102a in 30 nm thick, and W (tungsten) is formed as a second conductive film 1102b in 300 nm thick. The gate electrode 1102 may have a single-layer or multilayer structure. The conductive films may be formed with an element of Ta, W, Ti, Mo, and Al, or a synthetic material or a compound material containing the above element as its main component.

Further, a resist mask 1103 for patterning the first conductive film 1102a and the second conductive film 1102b into a predetermined shape is formed. A photoresist is applied onto the second conductive film by a spin-coating method or the like. Then, heat treatment, which is so-called prebake, is conducted to the applied photoresist. The temperature of the prebake is set to 50 to 120° C., which is lower than the temperature of postbake to be conducted later. In this embodiment, the prebake is conducted at 90° C. for 90 seconds.

After that, developing solution is dropped to the photoresist or the developing solution is sprayed from a spray nozzle so that the exposed photoresist is developed.

The postbake is conducted to the developed photoresist at 125° C. for 180 seconds so that moisture or the like remaining in the resist mask 1103 is removed and the stability against the heat is increased at the same time. By the postbake, a resist having a tapered shape at its end portions and having a trapezoid shape in which a lower base is longer than an upper base is formed.

In the case of forming a submicron TFT, the resist mask 1103a formed by the above method is etched isotropically to narrow the line width. With the resist mask 1103b narrowed thus, the conductive film is patterned. In the same way as the tapered shape of the resist mask, the first conductive film 1102a and the second conductive film 1102b have a tapered shape at their end portions (FIG. 12A).

The etched second conductive film 1102b has a gate length ranging from 0.2 to 1.0 μm. Moreover, the second conductive film 1102b has a shape shown in FIG. 12B by anisotropically etching the second conductive film 1102b. According to this method, a very small gate electrode 1201 having a gate length of 1.0 μm or less is formed.

Transistors for a functional circuit such as a driver, a CPU (central processing unit), or a radio-frequency ID tag are required to be smaller and to operate at higher speed; therefore, the miniaturization of the transistors is desired. According to this method, the conductive film can be patterned so as to have a width of 1 μm or less, which contributes to the miniaturization and high-speed operation.

Figure 13A:
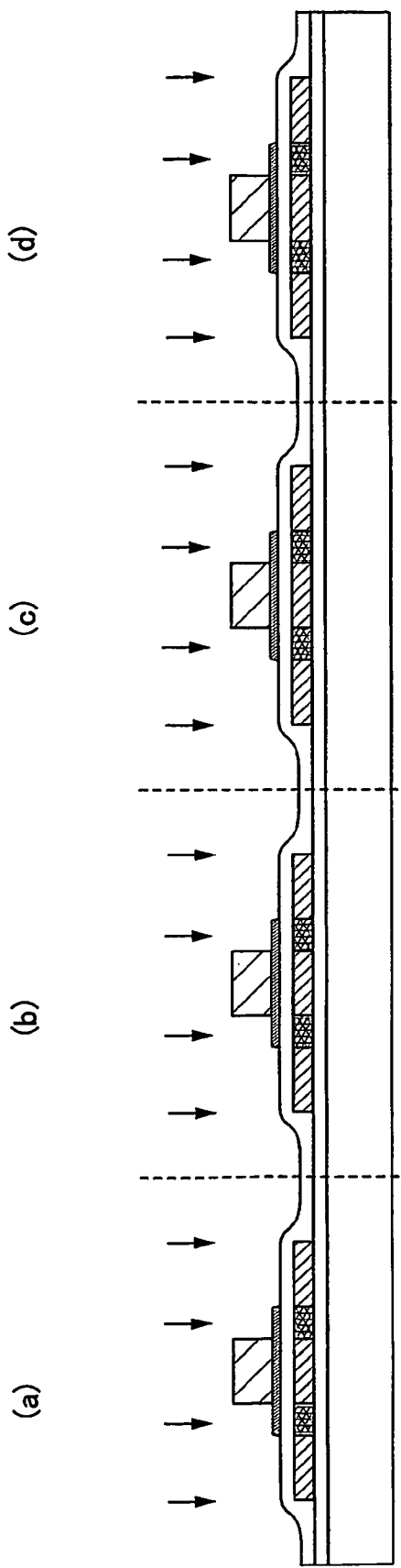
FIGS. 13A and 13B schematically show a process for manufacturing a TFT with the use of laser irradiation according to the present invention.

After that, the resist mask is removed by $O_2$ ashing or resist-peeling solution as shown in FIG. 13A. Then, an impurity element imparting N-type conductivity (P (phosphorus)) is added all over the surface using the gate electrode as a mask, thereby forming an impurity region in the semiconductor film. For example, phosphine ($PH_3$) or the like may be added.

Figure 13B:
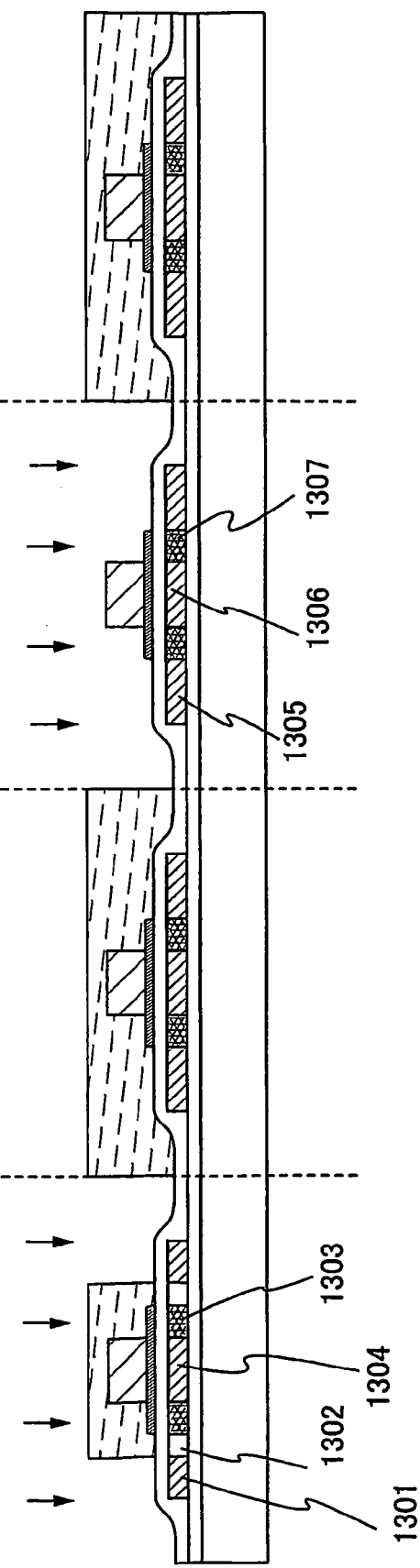

Next, a part of (a) and the whole surfaces of (b) and (d) are covered with a resist as shown in FIG. 13B. The resist is used as a mask in the case of (a) and the gate electrode is used as a mask in the case of (c) to add phosphorus (P), which is the impurity element imparting N-type conductivity.

In the region (a), a source region 1301 (or a drain region), a low-concentration impurity region 1302, and a region 1303 where the low-concentration region overlaps TaN serving as the gate electrode are formed in order from the end portions of the semiconductor film. A part just below W (tungsten) serving as the gate electrode becomes a channel region 1304. Thus, an N-channel TFT having an LDD region is formed in the region (a).

In the region (c), end portions of the semiconductor film containing a large amount of phosphorus (P) serve as source and drain regions 1305. The source region and the drain region sandwich a channel region 1306 therebetween. The source region and the drain region include a region 1307 overlapping TaN serving as the gate electrode. Thus, in the region (c), an N-channel TFT of a single-drain type is formed.

Figure 14:
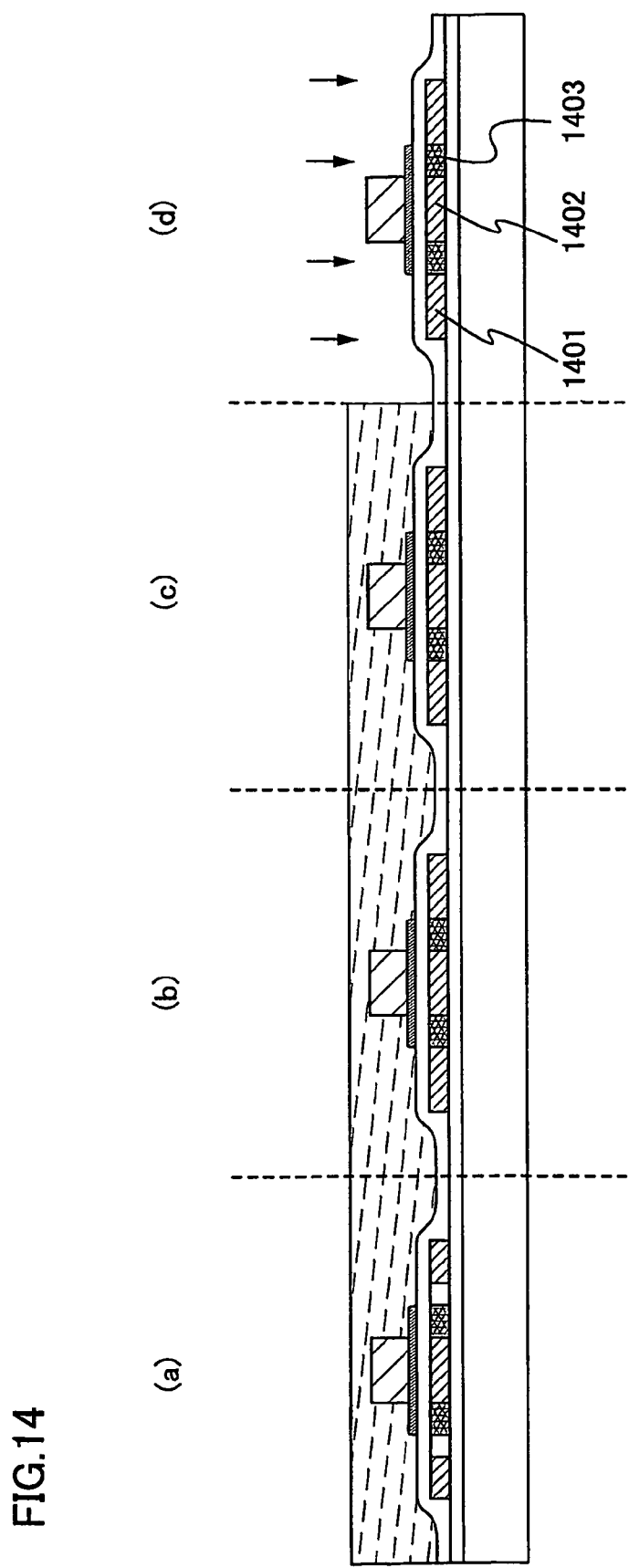
FIG. 14 schematically shows a process for manufacturing a TFT with the use of laser irradiation according to the present invention.

Moreover, a resist mask is formed in the regions (a) to (c) as shown in FIG. 14 to add boron (B), which is an impurity element imparting P-type conductivity, only to the region (d). In the region (d), end portions of the semiconductor film serve as source and drain regions 1401. The source region and the drain region sandwich a channel region 1402 therebetween. Further, the source region and the drain region include a region 1403 overlapping TaN serving as the gate electrode. Thus, in the region (d), a P-channel type TFT having a single-drain structure is formed. In the region (b), a TFT to become a capacitor is to be formed.

Figure 15A:
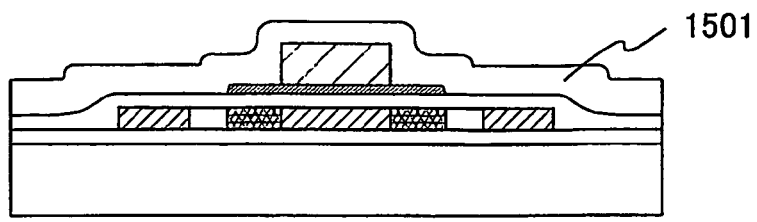
FIGS. 15A to 15C schematically show a process for manufacturing a TFT with the use of laser irradiation according to the present invention.

The following steps are the same in all of (a) to (d). As shown in FIG. 15A, the resist in the regions (a) to (c) is removed and a cap oxide film 1501 is formed so as to cover the TFT. In this embodiment, SiON (silicon oxynitride) is formed in 50 nm thick by a known method such as a plasma CVD method or a sputtering method.

Next, an impurity element added in the semiconductor film in the TFT is activated. In this embodiment, the activation is conducted at 570° C. for 3 minutes by a GRTA method. The activation may be conducted at 500 to 800° C. in a furnace filled with a nitrogen atmosphere.

Figure 15B:
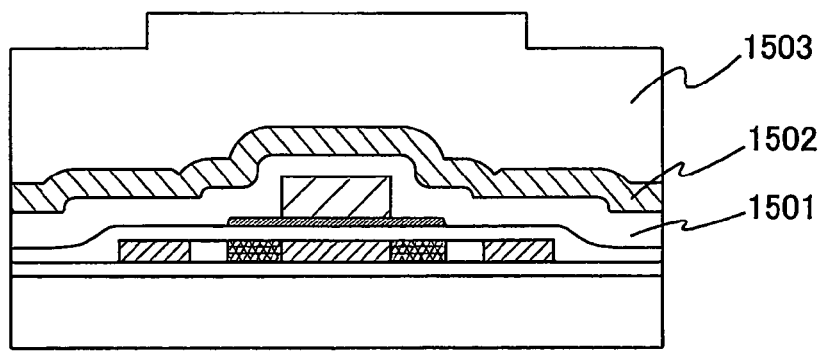

After that, as shown in FIG. 15B, insulating films 1502 and 1503 are formed so as to cover the cap oxide film 1501. The insulating films 1502 and 1503 can be formed with an insulating film containing at least oxygen or nitrogen such as silicon oxide, silicon nitride, silicon oxynitride, or silicon nitride oxide. In this embodiment, the insulating film 1502 is formed with silicon nitride oxide in 100 nm thick, while the insulating film 1503 is formed with silicon oxynitride in 500 nm thick. In particular, the insulating films 1502 and 1503 can contain much hydrogen by employing a plasma CVD method. Moreover, by conducting heat treatment at 410° C. for one hour, dangling bonds in the semiconductor film are decreased with hydrogen in the semiconductor film.

Figure 15C:
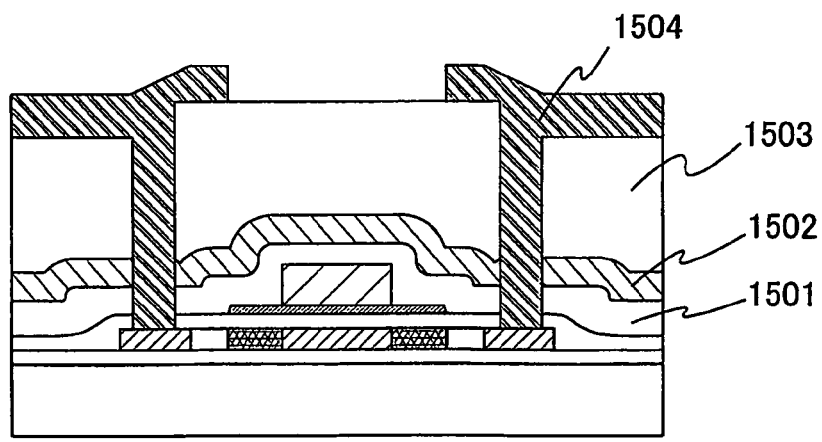

Next, as shown in FIG. 15C contact holes are formed in the gate insulating film and the insulating films, and wirings 1504 to connect with the impurity regions are formed. In this embodiment, Ti of 60 nm thick, TiN of 40 nm thick, Al—Si of 700 nm thick, and Ti of 100 nm thick are stacked in order, and then Ti, TiN, Al—Si, and Ti are sintered. With these steps, an N-channel TFT having an LDD structure, a capacitor element, an N-channel TFT having a single-drain structure, and a P-channel TFT having a single-drain structure are formed over the same substrate.

Embodiment 5

A TFT manufactured by using a laser irradiation apparatus of the present invention can be used for a thin film integrated circuit or a non-contact thin film integrated circuit device (also referred to as a radio-frequency IC tag or an RFID (Radio Frequency Identification). By applying the manufacturing method shown in another embodiment, the thin film integrated circuit and the non-contact thin film integrated circuit can be used as a tag or a memory.

An ID of the radio-frequency IC tag can be issued easily, and the information of the ID can be read at a distance. Therefore, the privacy needs to be protected. For example, there is a risk that the content of a shopping bag is scanned at a distance after having done the shopping and the ID is read out. Further, an individual may be identified from clothes or belongings. That it to say, people cannot walk with any belongings having ID numbers attached without having a risk that the information is read out against their wills and they are identified. Further, a conduct, for example compiling database from IDs and personal information, which is called computer-aided name identification, may increase and the number of forged products and counterfeit goods may increase due to the stealing and altering of leaked information.

Consequently, a memory used for the radio-frequency IC tag is preferably a memory in which the data can be erased or destroyed or a memory in which the reading is restricted. The former can be achieved by using a flash memory, and the latter can be achieved by using a write-once memory having a plurality of nonvolatile memories.

In this embodiment, an example of a flash memory as one of an EEPROM (Electrically Erasable and Programmable ROM) is shown as a memory constituting a part of a radio-frequency IC tag.

An EEPROM is known as a typical semiconductor nonvolatile memory. A floating gate memory is one of EEPROMs and has a poly-silicon layer or a conductive layer serving as a charge-accumulating layer. An example is hereinafter described in which a memory is manufactured by using a silicon quantum structure (silicon dot, that is, a microparticle of a silicon crystal) as a floating gate electrode instead of the conductive layer or the poly-silicon layer.

A silicon dot having a dimension of 10 nm or less particularly has a quantum effect to confine an electron in a three-dimensional direction, thereby having completely different properties from a normal silicon single crystal. For example, the silicon dot has properties of releasing electrons by applying voltage. Since the electric charge is quantized, the transistor can be operated by exchanging only one electron.

Figure 16A:
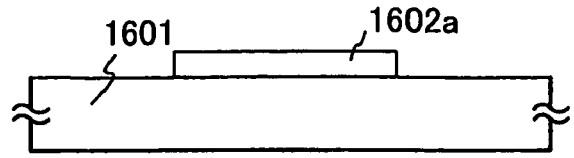
FIGS. 16A to 16F schematically show a process for manufacturing a memory with the use of laser irradiation according to the present invention.

As shown in FIG. 16A, a non-single crystal semiconductor film 1602a is formed over a substrate 1601. The substrate 1601 may be, for example, a glass substrate typified by a substrate made of aluminoborosilicate glass, barium borosilicate glass, or the like, a quartz substrate, a ceramic substrate, a stainless steel substrate, a flexible substrate typified by a plastic substrate or an acrylic substrate, a single-crystal semiconductor substrate (typically, an N-type or P-type single-crystal silicon substrate, a GaAs substrate, an InP substrate, a GaN substrate, a SiC substrate, or a ZnSe substrate), or the like. Further, an SOI (Silicon on Insulator) substrate may also be used.

When a base film (not shown) in contact with the substrate is necessary in the case of using the above substrates, the base film is formed appropriately. The base film is provided in order to prevent the diffusion into the semiconductor film of alkali-earth metal or alkali metal such as Na in the substrate. Alkali metal and alkali-earth metal cause adverse effects on the characteristic of a semiconductor element when such metal is in the semiconductor. Therefore, the base film is formed with an insulating film such as silicon oxide, silicon nitride, or silicon nitride oxide which can suppress the diffusion of alkali metal and alkali-earth metal into the semiconductor. Moreover, the base film may be provided in a single-layer or multilayer structure. The base film is not necessary when the substrate in which the diffusion of the impurity does not lead to any significant problems such as a quartz substrate is used. In this embodiment, the substrate 1601 includes a base film.

After forming the non-single crystal semiconductor film 1602a over the substrate 1601, the non-single crystal semiconductor film 1602a is etched into a desired shape by a photolithography step and an etching step. The material of the non-single crystal semiconductor film 1602a may be silicon (Si), germanium (Ge), silicon-germanium alloy, or a compound semiconductor material such as silicon carbide or gallium arsenic. The non-single crystal semiconductor film 1602a is formed by a known method such as a low-pressure thermal CVD method, a plasma CVD method, or a sputtering method.

Instead of the photolithography step, the non-single crystal semiconductor film 1602a may be patterned into a desired shape using a mask pattern formed by discharging an insulating material such as an organic resin or an inorganic material by an ink jet method, a droplet-discharging method, or the like which can discharge a material at a predetermined location. When the mask pattern is smaller, a smaller semiconductor region can be formed, thereby manufacturing a semiconductor device in which memory transistors are highly integrated.

Next, the non-single crystal semiconductor film 1602a is crystallized by a laser irradiation apparatus and a laser irradiation method of the present invention. The laser process may be conducted by the laser irradiation apparatus and the laser irradiation method of the present invention after crystallizing the non-single crystal semiconductor film 1602a by a solid-phase growth method including heat treatment. Alternatively, a microcrystal semiconductor film formed by using silane ($SiH_4$) as a material may be crystallized by employing a laser irradiation apparatus and a laser irradiation method of the present invention.

In this embodiment, in the same way as Embodiment Mode and another Embodiment, laser irradiation is conducted using a laser irradiation apparatus shown in FIG. 1. A CW laser, a laser (a femtosecond laser) having a pulse width of femtoseconds (1 femtosecond=$10^{-15}$ second), or a laser having a repetition rate of 10 MHz or more can be used.

In the above structure of the present invention, the following laser oscillators can be employed: (1) a CW laser such as a laser having a medium of a single-crystal YAG, $YVO_4$, forsterite ($Mg_2SiO_4$), $YAlO_3$, or $GdVO_4$, or a poly-crystal (ceramic) YAG, $Y_2O_3$, $YVO_4$, $YAlO_3$, or $GdVO_4$, each of which is doped with one or a plurality of Nd, Yb, Cr, Ti, Ho, Er, Tm, and Ta as dopant; a solid-state laser such as an alexandrite laser or a Ti:sapphire laser; a gas laser such as an Ar laser or a Kr laser; or a semiconductor laser such as a GaN laser, a GaAs laser, or an InAs laser (2) a laser having a pulse width of femtoseconds (1 femtosecond=$10^{-15}$ second, also referred to as a femtosecond laser) such as a Ti:sapphire laser, a laser using a chromium-forsterite crystal, or a Yb:YAG laser (the pulse width becomes femtoseconds by locking the mode) or (3) a pulsed laser having a repetition rate of 10 MHz or more such as a laser having a medium of a single-crystal YAG, $YVO_4$, forsterite ($Mg_2SiO_4$), $YAlO_3$, or $GdVO_4$, or a poly-crystal (ceramic) YAG, $Y_2O_3$, $YVO_4$, $YAlO_3$, or $GdVO_4$, each of which is doped with one or a plurality of Nd, Yb, Cr, Ti, Ho, Er, Tm, and Ta as dopant; an Ar ion laser; or a Ti:sapphire laser.

After emitting a laser beam from the above-described laser, opposite end portions of the laser beam are blocked by a slit. Then, an image formed at the slit is projected onto an irradiation surface using a condensing lens. Since diffraction occurs by passing through the slit, it is necessary that the diffraction light does not reach the semiconductor film. For example, the condensing lens may be arranged so as to be conjugated with the slit and the irradiation surface.

Before crystallizing the non-single crystal semiconductor film 1602a using the laser irradiation apparatus and the laser irradiation method of the present invention, a crystallization step using a catalyst element may be provided. The catalyst element is, for example, Ni, Ge, Fe, Pd, Sn, Pb, Co, Pt, Cu, or Au. The catalyst element is added to the non-single crystal semiconductor film 1602a by, for example, coating the non-single crystal semiconductor film 1602a with solution containing the above element or a compound of the above element and then heat treatment is conducted to crystallize the non-single crystal semiconductor film 1602a. When the crystallization step by the laser beam is conducted after this crystallization step, the laser irradiation melts an upper part of the semiconductor film but does not melt a lower part of the semiconductor film. Therefore, a crystal remaining without being melted in the lower part of the semiconductor film becomes a crystal nucleus, and the crystallization is promoted from the lower part toward the upper part of the semiconductor film.

The crystallization may be performed in such a way that the heat treatment is performed after the catalyst element is added in order to promote the crystallization and that the laser irradiation is conducted. Alternatively, the heat treatment may be omitted. After the heat treatment, the laser irradiation may be conducted while keeping the temperature of the heat treatment.

By conducting the laser irradiation using the laser irradiation apparatus of the present invention, the width of the microcrystal region in the laser irradiation region can be decreased to be in the range of 1 to 20 μm; therefore, TFTs manufactured with thus formed semiconductor film have superior and homogeneous characteristics. Moreover, since the restriction on the layout and the size decreases very much, the design rule in manufacturing a semiconductor device is drastically relaxed. Furthermore, since the region not applicable to the semiconductor device drastically decreases, the yield increases, which contributes to the cost reduction according to the present invention.

Moreover, a crystalline semiconductor film 1602b may be doped with $B_2H_6$ in order to control the threshold voltage of a transistor formed afterward.

Figure 16B:
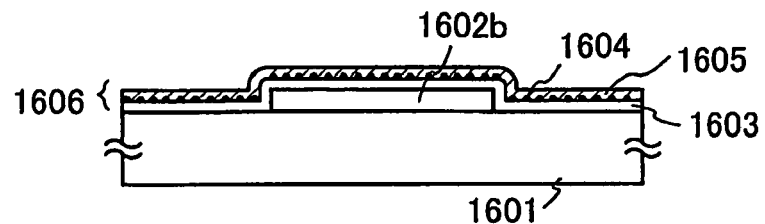

Next, a first insulating film 1603 is formed over the substrate 1601 and the crystalline semiconductor film 1602b (FIG. 16B). The first insulating film 1603 is formed in thicknesses from 1 to 100 nm, preferably from 1 to 10 nm, and more preferably from 2 to 5 nm. The first insulating film 1603 serves as a tunnel oxide film in a memory transistor to be later formed. As the first insulating film 1603 gets thinner, the tunnel current becomes easier to flow, thereby accumulating the charges in a floating gate electrode at lower voltage. As a result, the power consumption of the semiconductor device to be later formed can be decreased.

The first insulating film 1603 is formed thinly in such a way that the surface of the semiconductor film 1602b is oxidized so as to form a thermal oxide film by a GRTA (Gas Rapid Thermal Anneal) method, an LRTA (Lamp Rapid Thermal Anneal) method, a process using oxygen plasma, or the like. Alternatively, the first insulating film 1603 can be formed by a PVD (Physical Vapor Deposition) method, a CVD (Chemical Vapor Deposition) method, a coating method, or the like. The first insulating film 1603 can be formed with a silicon oxide film and a silicon nitride film. A silicon oxide film and a silicon nitride film may be stacked in order from the substrate 1601 side, or a silicon oxide film, a silicon nitride film, and a silicon oxide film may be stacked in order from the substrate 1601 side. It is preferable to form a silicon oxide film in contact with a semiconductor region because the interface state density between the gate insulating film and the semiconductor region decreases. In this embodiment, the first insulating film 1603 is formed by stacking a silicon oxide film and a silicon nitride film.

Next, a first conductive film 1606 is formed over the first insulating film 1603 by a sputtering method. Here, solid solution having silicon beyond the solid solubility limit with respect to a metal element of the main component is used as a target. The metal element capable of forming the solid solution with silicon is, for example, beryllium (Be), aluminum (Al), zinc (Zn), gallium (Ga), germanium (Ge), silver (Ag), cadmium (Cd), indium (In), tin (Sn), antimony (Sb), gold (Au), lead (Pd), or bismuth (Bi).

A conductive layer 1605 is formed with microparticles 1604 of a silicon crystal and one or a plurality of the above metal elements by sputtering with the use of, as a target, silicon beyond the solid solubility limit concentration at the film-forming temperature and the solid solution containing one or a plurality of the above metal elements. Each microparticle 1604 of the silicon crystal here has a diameter of 10 to 50 nm, preferably 20 to 30 nm. When the conductive layer 1605 including the microparticles 1604 of the silicon crystal and the above metal element is formed while heating the substrate, the density of the microparticles 1604 of the silicon crystal increases, thereby increasing the diameter of each microparticle 1604 of the silicon crystal.

Figure 17A:
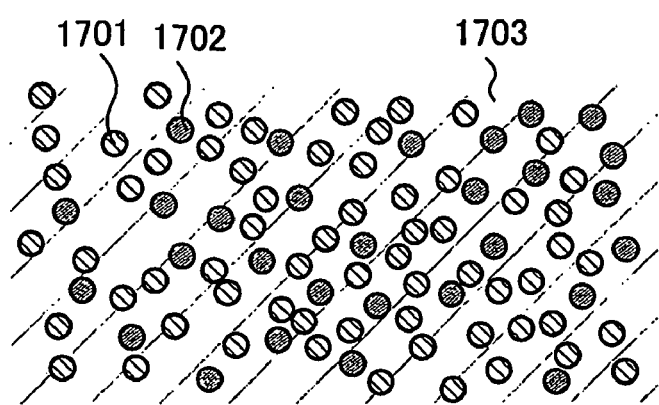
FIGS. 17A to 17D schematically show a process for manufacturing a memory with the use of laser irradiation according to the present invention.

The principle in which the conductive layer 1605 containing the microparticles 1604 of the silicon crystal and the above metal element is formed is described with reference to FIG. 17. FIG. 17A is a top view of a substrate 1703 at an initial stage of the sputtering. The substrate 1703 is, for example, a glass substrate made of barium borosilicate glass, aluminoborosilicate glass, or the like, a quartz substrate, a ceramic substrate, or a stainless steel substrate. A substrate made of a flexible material typified by plastic or acrylic can also be used as long as the substrate can resist the heat temperature of this process. Although the substrate is illustrated alone, the substrate may include an insulating film such as the first insulating film 1603 formed over the substrate as shown in FIG. 16B.

When the sputtering is conducted using the above solid solution as a target, a particle 1701 containing a metal element and a microparticle 1702 of a silicon crystal is precipitated over the substrate 1703. Although silicon is dissolved in the particle 1701 containing the metal element, silicon is precipitated as the microparticle 1702 of the silicon crystal when the concentration of silicon in the particle 1701 exceeds the solid solubility limit concentration of silicon. A conductive layer is formed by the growth of the particle 1701 containing the metal element.

Figure 17B:
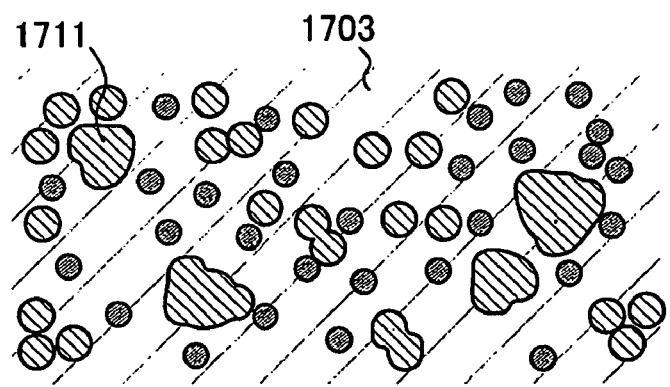

Further, when the sputtering is conducted while heating the substrate 1703, a particle 1711 containing the metal element grows on the surface of the substrate 1703 as shown in FIG. 17B. When the melting point of the metal element is lower than that of silicon, the particle 1711 containing the metal element selectively grows.

Figure 17C:
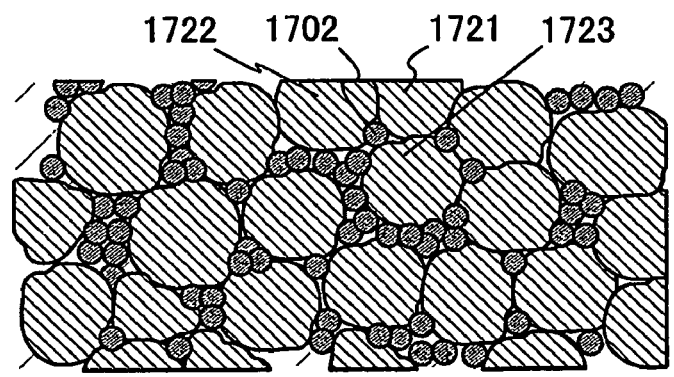

Next, as shown in FIG. 17C, when the particle containing the metal element grows, particles 1721 to 1723 containing the metal element lie adjacent to each other. The microparticle 1702 of the silicon crystal partially segregates at the boundary between the particles containing the metal element. Moreover, when the sputtering is continued further, the particles 1721 to 1723 containing the metal element grow to become the conductive layer. Thus, a conductive film including conductive layers and the microparticle 1702 of the silicon crystal is formed.

Figure 17D:
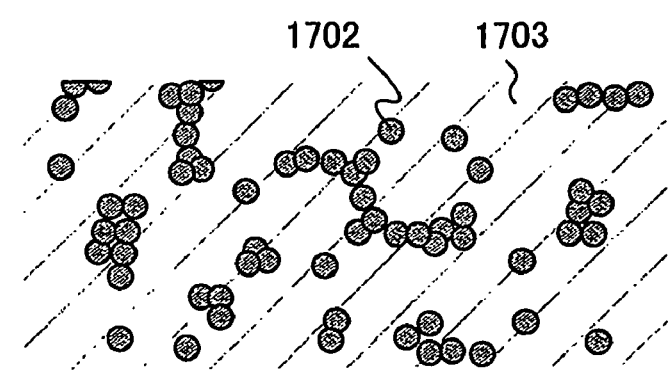

Next, as shown in FIG. 17D, the microparticle 1702 of the silicon crystal can be formed over the substrate 1703 by removing the layer containing the metal element (that is, the conductive layer).

Figure 16C:
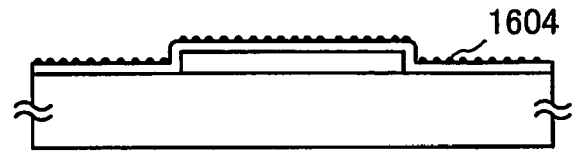

In this way, the conductive layer 1605 of the first conductive film is removed as shown in FIG. 16C. Here, it is preferable to use a technique to remove the conductive layer selectively, typically a wet etching method. As a result, the microparticles 1604 of the silicon crystal and the first insulating film 1603 can be exposed.

Figure 16D:
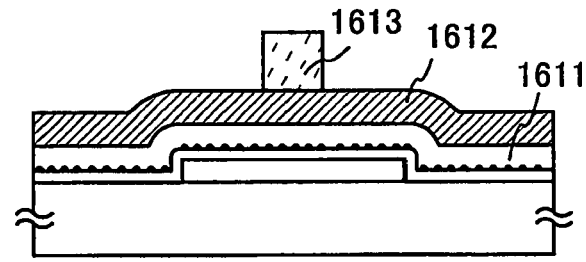

Next, a second insulating film 1611 and a second conductive film 1612 are formed over the microparticles 1604 of the silicon crystal and the first insulating film 1603 as shown in FIG. 16D.

The second insulating film 1611 is formed in 1 to 100 nm thick, preferably 10 to 70 nm thick, and more preferably 10 to 30 nm thick. The second insulating film 1611 needs to keep electrically insulating the gate electrode and the floating gate electrode formed afterward in the memory transistor. Therefore, it is preferable to set the film thickness of such a degree that the leak current does not increase therebetween. The second insulating film 1611 can be formed with a silicon oxide film and a silicon nitride film in the same way as the first insulating film 1603. A silicon oxide film and a silicon nitride film may be stacked in order from the substrate 1601 side, or a silicon oxide film, a silicon nitride film, and a silicon oxide film may be stacked in order from the substrate 1601 side. In this embodiment, the second insulating film 1611 is formed in a multilayer structure including a silicon oxide film of 10 nm thick and a silicon nitride film of 20 nm thick.

The second conductive film 1612 can be formed by a known method such as a sputtering method, an evaporation method, or a CVD method. The second conductive film 1612 can be formed with an element selected from tantalum (Ta), tungsten (W), titanium (Ti), molybdenum (Mo), aluminum (Al), chromium (Cr), and neodymium (Nd), or with an alloy material or a compound material containing the above element as its main component. Alternatively, a semiconductor film doped with an impurity element may be used. Here, the second conductive film 1612 is formed with an aluminum thin film by a sputtering method.

Subsequently, after forming the second insulating film 1611, a second conductive film containing a microparticle of a silicon crystal may be formed and the conductive layer may be removed. Then, a third insulating film may be formed and the third insulating layer containing a microparticle of a silicon crystal may be formed. Further, the same step may be repeated to form a plurality of insulating layers containing a microparticle of a silicon crystal. In this case, a memory transistor formed later has a plurality of floating gate electrodes.

Next, a mask pattern 1613 is formed over the second conductive film 1612. The mask pattern 1613 can be formed by a known photolithography step. The mask pattern 1613 may be formed by the technique used when forming the semiconductor region 1602b. Moreover, the mask pattern 1613 formed by the above technique can be slimmed by, for example, ashing to narrow the width of the mask pattern 1613. As a result, a TFT having a short-channel structure in which the width of the gate electrode to be formed later is narrow can be formed, and a TFT capable of high-speed operation can also be formed. It is to be noted that the mask pattern 1613 is to form the gate electrode later. Therefore, in the case of forming the gate electrode by a droplet-discharging method, the mask pattern 1613 is not necessarily provided.

Figure 16E:
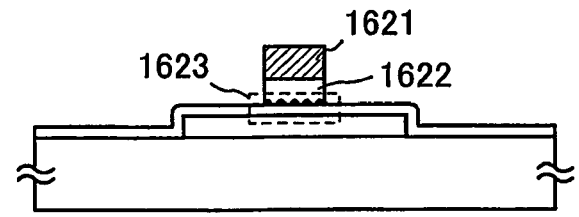

Next, the second conductive film 1612 is etched by using the mask pattern 1613 to form a gate electrode 1621 as shown in FIG. 16E. The second conductive film 1612, the first insulating film 1603, and the microparticles 1604 of the silicon crystal are etched by a known etching method such as a wet etching method or a dry etching method. When the first insulating film 1603 where the microparticles 1604 of the silicon crystal are formed is thin, the first insulating film 1603 may have a defect due to the plasma bombardment in the dry etching. Therefore, the etching is preferably conducted by a wet etching method. Here, the microparticles 1604 of the silicon crystal are removed by a wet etching method using NMD$_3$ solution (solution containing tetramethylammonium hydroxide for 0.2 to 0.5%) or the like.

The width of the gate electrode 1621 is preferably set 0.2 to 1.5 µm, preferably 0.2 to 0.7 µm. By setting the width of the gate electrode 1621 within this range, the memory transistor having shorter channel length can be formed later, and moreover, a semiconductor device capable of high-speed operation can be manufactured.

Next, the second insulating film 1611 is etched, thereby forming a second insulating layer 1622 and exposing the microparticles 1604 of the silicon crystal in a part not covered by the mask pattern 1613.

Next, the exposed microparticles 1604 of the silicon crystal are etched, thereby forming a floating gate electrode 1623 including the microparticle of the silicon crystal. The floating gate electrode 1623 is formed with dispersed particles. Therefore, when the first insulating film 1603 serving as a tunnel oxide film has a defect, it is possible to prevent all the charges accumulated in the floating gate electrode 1623 from flowing from the defect into the semiconductor region. Accordingly, a memory transistor having high reliability can be formed.

Next, the crystalline semiconductor region 1602b is doped with an impurity element imparting N-type or P-type conductivity using the gate electrode 1621 as a mask.

Figure 16F:
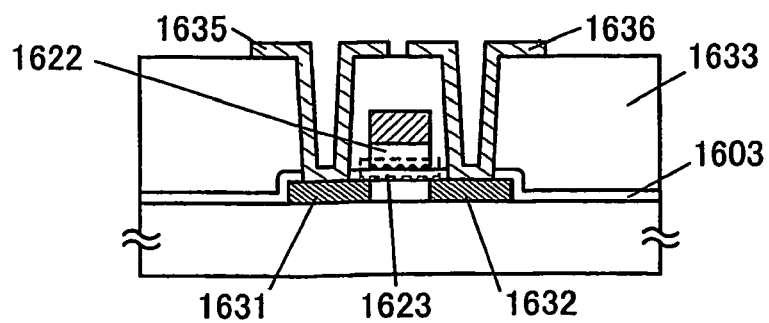

Next, an insulating film (not shown) is formed and the impurity element is activated by heat treatment, a GRTA method, an LRTA method, or the like so that a source region and a drain region 1631 and 1632 are formed (FIG. 16F). After that, an inorganic insulating film (not shown) formed with a silicon nitride film may be provided over the second insulating layer 1622 and the gate electrode 1621, followed by heat treatment. By forming this inorganic insulating film (not shown) under a condition where hydrogen is contained in the film and conducting the heat treatment, hydrogenation can be performed to terminate a dangling bond in each semiconductor region.

Next, a third insulating film 1633 serving as an interlayer insulating film is formed. The third insulating film 1633 can be formed with an organic resin having heat resistance such as polyimide, acrylic, or polyamide. In addition to the above organic resin, a low dielectric-constant material (a low-k material) or siloxane can be used. Siloxane is a material having a bond of silicon and oxygen expressed with —Si—O—Si— (siloxane bond) as a basic unit and having a bond of silicon and fluorine, aliphatic hydrocarbon, aromatic hydrocarbon, or the like. The third insulating film 1633 can be formed by spin coating, dipping, spray coating, a droplet-discharging method (an ink-jet method, screen printing, offset printing, and so on), a doctor's knife, a roll coater, a curtain coater, a knife coater, a CVD method, an evaporation method, or the like selected in accordance with the material of the third insulating film 1633. An inorganic material such as silicon oxide, silicon nitride, silicon oxynitride, PSG (phosphosilicate glass), or BPSG (borophosphosilicate glass) is also applicable. The third insulating film 1633 may be formed by stacking these insulating films. Here, the third insulating film 1633 is formed by applying and baking acrylic.

Next, a part of the third insulating film 1633 and a part of the first insulating film 1603 are etched by a photolithography step and an etching step, thereby forming a contact hole and partially exposing the source region and the drain region. The etched third insulating film is shown as the third insulating film 1633, and the etched first insulating film is shown as the first insulating film 1603. Although the third insulating film 1633 is illustrated as having a flat surface, the surface is not necessarily flat.

Subsequently, a source electrode and a drain electrode 1635 and 1636 to be connected with the source region and the drain region are formed. The source electrode and the drain electrode 1635 and 1636 are formed by providing a conductive film by a PVD method, a CVD method, an evaporation method, or the like and then etching the conductive film into a desired shape. The conductive layer can be formed selectively at a predetermined location by a droplet-discharging method, a printing method, an electrolytic plating method, or the like. Furthermore, a reflow method or a damascene method is applicable. The source region and the drain region are formed with metal selected from Ag, Au, Cu, Ni, Pt, Pd, Ir, Rh, W, Al, Ta, Mo, Cd, Zn, Fe, Ti, Si, Ge, Zr, and Ba, or with alloy or nitride containing the above metal. The source region and the drain region may have a multilayer structure including those.

In the case of forming silicon particles dispersed three-dimensionally in the first conductive layer, a memory transistor having a floating gate electrode 1623 in which silicon particles are dispersed three-dimensionally as shown in FIG. 16E can be formed.

According to the following method, a memory transistor can be peeled from the substrate 1601 shown in FIG. 16A The peeling method is; (1) a substrate which can resist against the heat of approximately 300 to 500° C. is used as the substrate 1601, a metal oxide film is provided between the substrate 1601 and the memory transistor, and the metal oxide film is weakened by crystallization, thereby peeling the memory transistor, (2) a non-single crystal silicon film containing hydrogen is provided between the substrate 1601 and the memory transistor, and the non-single crystal silicon film is removed by laser beam irradiation or by etching with the use of gas or solution, thereby peeling the memory transistor, or (3) the substrate 1601 over which the memory transistor is formed is erased mechanically or removed by etching with the use of solution or gas such as $CF_3$, thereby separating the memory transistor, or the like. The memory transistor can be adhered to a flexible substrate by using an adhesive available in the market, for example an epoxy resin adhesive or a resin additive.

When the peeled memory transistor is adhered to the flexible substrate as mentioned above, a semiconductor device which is thin, lightweight, and hard to be damaged even when the device is dropped can be provided. Since the flexible substrate has flexibility, the substrate can be adhered to a curved plane or other deformed planes, thereby allowing various applications. By reusing the substrate 1601, an inexpensive semiconductor device, can be provided.

According to the above process, the memory transistor of a flash memory comprising the semiconductor region 1602b, the first insulating layer 1603 serving as the tunnel oxide film, the floating gate electrode 1623, the second insulating layer 1622, and the gate electrode 1621 can be formed.

In addition, a plurality of semiconductor devices can be taken out from a large substrate used as the substrate 1601 in such a way that circuit patterns of a plurality of semiconductor devices are formed over the substrate according to the above steps and the substrate is divided into rectangles or strips. Through these steps, a large amount of semiconductor devices can be formed, thereby allowing the cost reduction.

By peeling the memory transistor manufactured in this embodiment and adhering the memory transistor to a flexible substrate, a thin semiconductor device can be manufactured.

Through the steps of this embodiment, a semiconductor device having silicon particles in a floating gate electrode over a large substrate can be manufactured by a sputtering method. For this reason, semiconductor devices can be manufactured by cutting out plural thin film integrated circuits after thin film circuits having memory transistors are formed using a large substrate; therefore, cost reduction of the semiconductor device is achieved.

By employing a sputtering method, silicon particles dispersed three-dimensionally can be formed. Therefore, the density of silicon particles serving as the charge-accumulating layer can be increased, and the amount of change in the threshold voltage can be increased.

Moreover, it is possible to increase the size of a silicon particle while avoiding the unification of many silicon particles, to increase the amount of charges implanted into each particle, and to increase the shift amount of the threshold voltage.

Moreover, since silicon particles dispersed in the floating gate electrode of the memory transistor is used, the outflow of the accumulated charges due to the defect of the tunnel oxide film can be avoided. This makes it possible to form a semiconductor device of high reliability.

Embodiment 6

This embodiment describes a write-once memory as an example of a memory for forming a radio-frequency IC tag. A memory cell of a write-once memory includes a fuse, an anti-fuse (normally in an insulated state but turns to be in a connected state by applying a writing-in voltage), a cross pointer diode, an OLED (organic light-emitting diode), a bistable liquid crystal element (a liquid crystal element having such properties as that two stable states can be obtained under one condition), or a device such as polymer or metal that changes its state by applying heat or light such as a laser beam. The write-once memory described in this embodiment has the TFT manufactured by another embodiment.

Although this embodiment shows an example of using, for a radio-frequency IC tag, the write-once memory cell which writes data by insulating the TFT by applying voltage, a write-once memory cell using another device mentioned above may also be used for the radio-frequency IC tag.

Usually, a recording device records data when the memory cell has one of two states. A write-once recording device is manufactured so that all the memory cells have a first state. When a writing-in process is received, only a designated memory cell is changed to have a second state. The change from the first state into the second state is irreversible, and the memory cell whose state has been changed once cannot be returned to an initial state.

In TFTs manufactured over an insulating substrate, a channel region of the TFT becomes insulated when voltage higher than the voltage for generally operating the TFT is applied between the gate electrode and at least one of the two impurity regions (including a high-concentration impurity region). To show this operation, the cross-sectional view of the TFT before and after applying the voltage to the TFT is shown in FIGS. 18A and 18B.

Figure 18A:
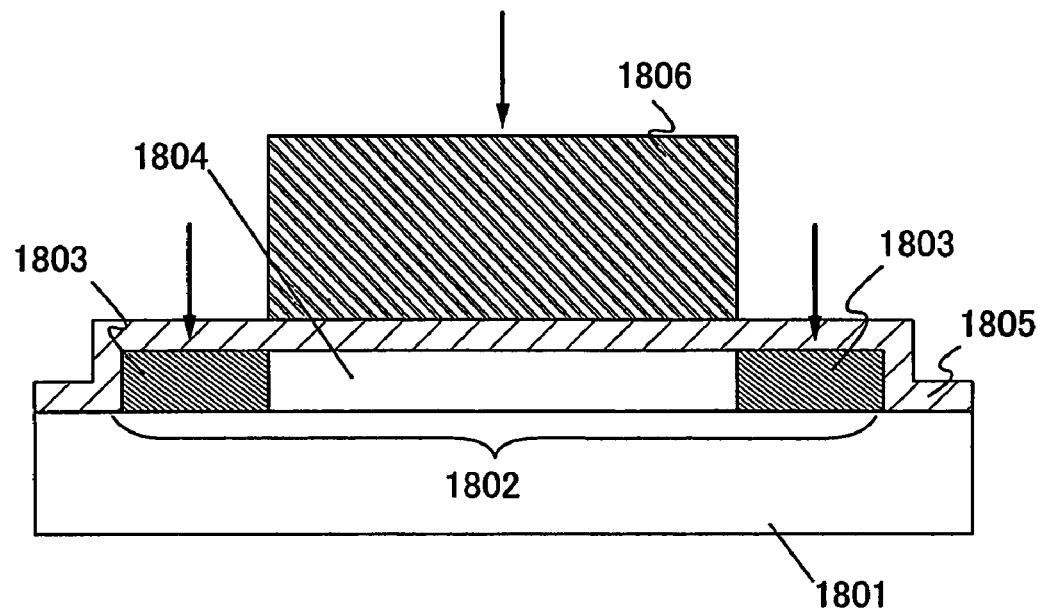
FIGS. 18A and 18B schematically show a process for manufacturing a memory with the use of laser irradiation according to the present invention.

For example, the TFT shown in FIG. 18A has a semiconductor film 1802 over an insulating substrate 1801, a gate insulating film 1805 is formed over the semiconductor film 1802, and a gate electrode 1806 is formed over the gate insulating film 1805. The semiconductor film 1802 has two high-concentration impurity regions 1803 and a channel region 1804.

Figure 18B:
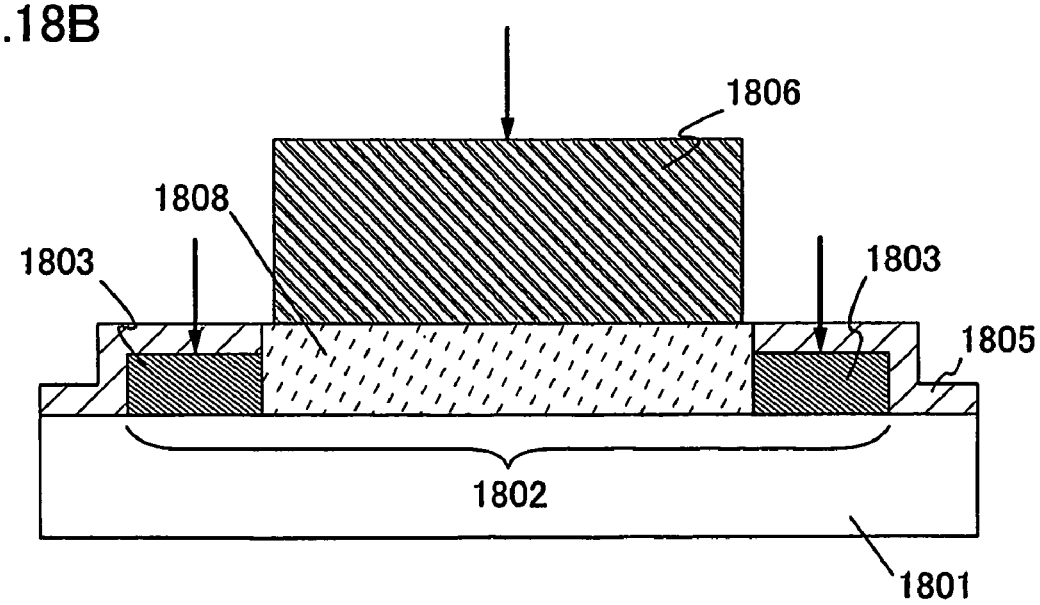

FIG. 18B schematically shows a TFT after applying voltage thereto. By applying the voltage, the channel region 1804 of the TFT at least alters, and an insulated region 1808 is formed under the gate electrode 1806. For this reason, the gate electrode 1806 and each of the two high-concentration impurity regions 1803 are insulated. In FIG. 18B, the insulated region 1808 is shown schematically, and the actually-insulated region can have various shapes.

For example, in the case of a TFT having a channel length of 4 μm and a channel width of 4 μm and having a gate insulating film of 20 nm thick manufactured over a glass substrate, voltage of 25 V is applied for 500 μs between the gate electrode 1806 and at least one of the two high-concentration impurity regions 1803. Then, the channel region 1804 of the TFT is insulated, and the gate electrode 1806 and each terminal of the two high-concentration impurity regions 1803 are insulated.

The term of "alter" in this specification concretely indicates the change of at least the channel region 1804 into the insulated state by applying voltage to the TFT. In addition to the TFT having the above-mentioned size, at least the channel region 1804 can be insulated by changing the condition for applying the voltage.

Thus, when voltage higher than the voltage for operating the TFT is applied between the gate electrode 1806 and at least one of the two impurity regions (the high-concentration impurity region 1803 in this embodiment), current flows into the gate insulating film 1805. Since the insulating film is formed with a material having high resistance, heat is generated when the current flows therethrough. Since the insulating substrate 1801 basically has low heat conductivity, the insulating substrate 1801 cannot let heat out even when a large amount of heat generated in the TFT manufactured over the insulating substrate 1801. Therefore, the generated heat burns the gate insulating film 1805 and the semiconductor film 1802. This makes it possible to insulate the gate electrode 1806 and each terminal of the two high-concentration impurity regions 1803. On the other hand, in the case of manufacturing a TFT over a silicon substrate having high heat conductivity, even though the current flows through the gate insulating film to generate heat, the insulating film and the silicon substrate are not burnt.

In the experiments relating to the present invention, when voltage is applied to the gate electrode 1806 and at least one of the two high-concentration impurity regions 1803, the channel region 1804 is insulated with a possibility of approximately 97%. Moreover, it has been confirmed that the gate electrode 1806 and each terminal of the two high-concentration impurity regions 1803 are insulated state, that is, non-conductive state. The rest of approximately 3% is a defective mode element. That is to say, after applying the voltage, the channel region 1804 becomes a resistive element, and the gate electrode 1806 and each of the two high-concentration impurity regions 1803 are conductive state. As a factor of the defective mode element, dust in the semiconductor film 1802 or the insulating films is considered. When the semiconductor film is annealed by using a laser irradiation apparatus of the present invention, the width of the microcrystal region in the laser irradiation region can be decreased to be in the range of 1 to 20 μm, thereby annealing the whole surface of the semiconductor film homogeneously. Therefore, the accuracy in manufacturing the TFT's and the characteristics of the TFTs are improved. As a result, the defective mode element can be reduced. Further, the defective mode element can be further reduced by making the defective mode element have a double-gate electrode as the TFT shown in Embodiment 3 or adding a redundant circuit.

It is to be noted that the recording device is a device for storing data by having the memory cell take one of certain two states. In the recording device in this embodiment, the data can be saved in such a way that the channel region of the TFT serving as the memory cell has either one of the following two states; the channel region remains to be an initial state or is an insulated state.

Consequently, a write-once memory is manufactured while recognizing the TFT of the initial state before applying the voltage as "1", and the TFT of the insulated state by insulating the channel region after applying the voltage as "0" according to the above structure. The correspondence between the states of the TFT and the numerals "0" and "1" is not limited to this.

In this embodiment, unlike another memory such as an SRAM or a DRAM, one memory cell can be constituted by one TFT. Therefore, in the case of constituting a memory array with many memory cells, the size of the memory array can be smaller than that when using another memory, which makes the integration easy.

Embodiment 7

Various electronic appliances can be completed by using a semiconductor material to which laser irradiation has been conducted by the present invention. By applying the present invention, a laser irradiation process can be homogeneously performed to a semiconductor film; therefore, the degree of freedom in the layout and size of semiconductor elements over a substrate can be increased and the degree of integration can be increased. Further, the quality of products of the manufactured semiconductor elements is superior, and these semiconductor elements do not have variation. Specific examples of the electronic appliances are described with reference to FIGS. 19A to 19E.

Figure 19A:
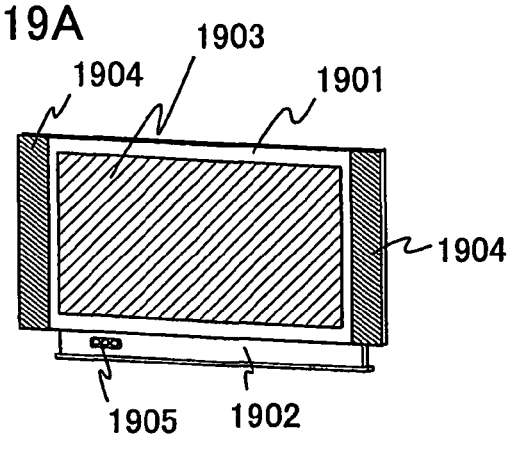
FIGS. 19A to 19E schematically show a process for manufacturing an electronic appliance with the use of laser irradiation according to the present invention.

FIG. 19A shows a display device including a case 1901, a supporting stand 1902, a display portion 1903, speaker portions 1904, a video input terminal 1905, and the like. This display device is manufactured by using a thin film transistor formed by the manufacturing method shown in another embodiment in the display portion 1903. The display device includes a liquid crystal display device, a light-emitting device, and the like, and specifically includes all the display devices for displaying information for a computer, television reception, advertisement, and so on.

Figure 19B:
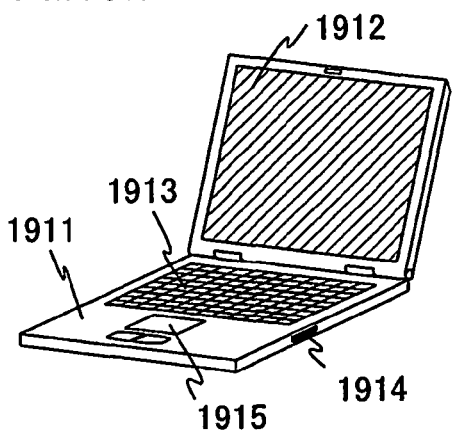

FIG. 19B shows a computer including a case 1911, a display portion 1912, a keyboard 1913, an external connection port 1914, a pointing mouse 1915, and the like. The manufacturing method shown in another embodiment can be applied to the display portion 1912 and other circuits. Moreover, the present invention can be applied to a semiconductor device inside a main body such as a CPU or a memory.

Figure 19C:
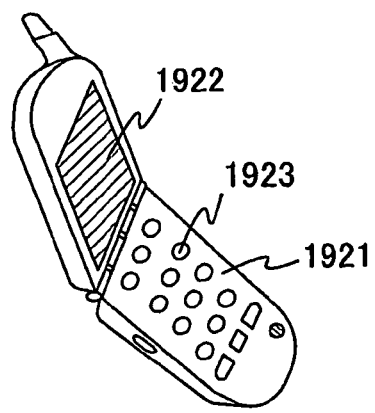

FIG. 19C shows a mobile phone as a typical example of mobile terminals. This mobile phone includes a case 1921, a display portion 1922, operation keys 1923, and the like. Since an electronic appliance such as a mobile phone, a PDA (personal digital assistant), a digital camera, or a compact game machine is a mobile terminal, a display screen is small. Therefore, by forming functional circuits such as a CPU or a memory using a fine transistor shown in another embodiment, a smaller and lighter device can be manufactured.

Figure 19D:
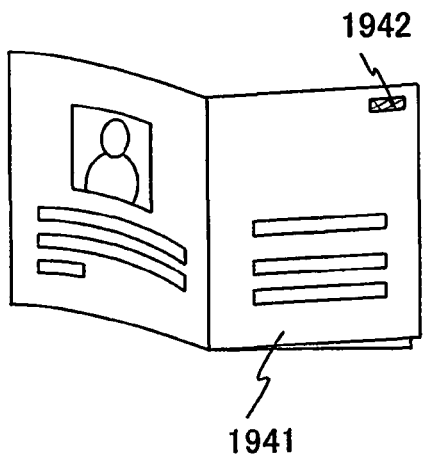

FIG. 19D shows a passport 1941 to which a radio-frequency IC tag 1942 is attached. The radio-frequency IC tag may be embedded in the passport 1941. In the same way, the radio-frequency IC tag may be attached to or embedded in a driver's license, a credit card, a banknote, a coin, a certificate, a merchandise coupon, a ticket, a traveler's check (T/C), a health insurance card, a residence certificate, a family register, or the like. In this case, only the information showing that this product is a real one is inputted into the radio-frequency IC tag, and access authority is set so that the information is not read out or written in illegally. This can be achieved by using a memory shown in another embodiment. Thus, by using the tag, the real product can be distinguished from forged ones.

Figure 19E:
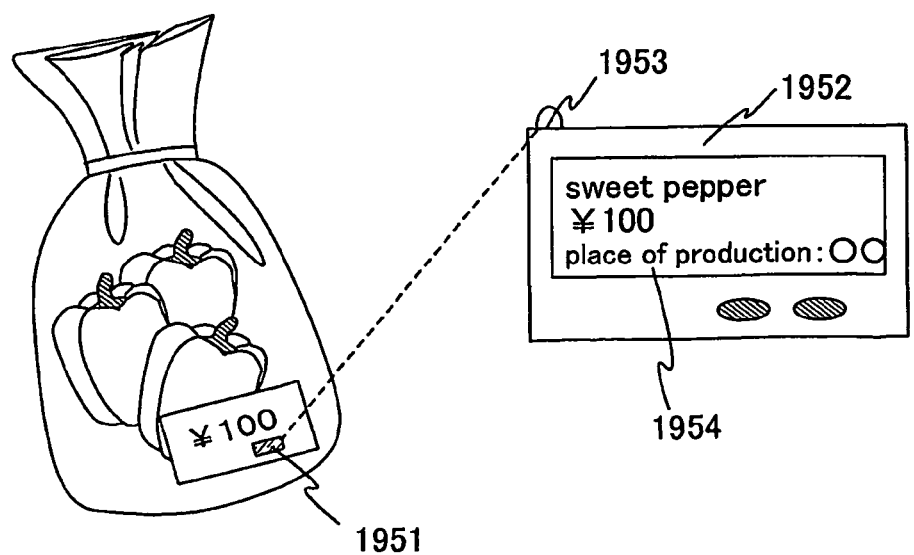

Besides, the radio-frequency IC tag can also be used as a memory. FIG. 19E shows an example of using the radio-frequency IC tag 1951 as a label attached to a package of vegetables. The radio-frequency IC tag may be attached to or embedded in the package. In the radio-frequency IC tag 1951, a production area, a producer, a manufacturing date, a process at the production such as a process method, a circulation process of a product, a price, quantity, an intended purpose, a shape, weight, an expiry date, or other identification information can be stored. The information from the radio-frequency IC tag 1951 can be received by an antenna portion 1953 of a radio-frequency reader 1952, and read out, and displayed in a display portion 1954 of the reader 1952. Thus, wholesalers, retailers, and consumers can know such information easily.

Further, by setting the access authority for each of the producers, the traders, and the consumers, reading-in, writing-in, rewriting, and erasing cannot be conducted in the case of not owning the access authority.

The radio-frequency IC tag can be used as follows. At the settlement the information that the settlement has been made is written in the radio-frequency IC tag, and the radio-frequency IC tag is checked by checking means provided at the exit whether or not the information that the settlement has been made is written in the radio-frequency IC tag. If the IC tag is brought out from the store without making the settlement, the alarm rings. With this method, forgetting of the settlement and shoplifting can be prevented.

In consideration of protecting customer's privacy, the following method is also possible. At the settlement at a cash register, any of the followings is conducted; (1) data inputted in the radio-frequency IC tag is locked by pin numbers or the like, (2) data itself inputted in the radio-frequency IC tag is encrypted, (3) data inputted in the radio-frequency IC tag is erased, and (4) data inputted in the radio-frequency IC tag is destroyed. Then, checking means is provided at an exit, and whether any one of (1) to (4) has been conducted or whether the data in the radio-frequency IC tag is not processed is checked so that whether the settlement has been made or not is checked. In this way, whether the settlement has been made or not can be checked in the store, and reading out the information in the radio-frequency IC tag against the owner's will outside the store can be prevented.

Since these radio-frequency IC tags mentioned above are expensive in its manufacturing cost compared with conventionally used barcodes, the cost reduction is necessary. According to the present invention, however, the proportion of the boundary portion between the adjacent crystallized regions (that is, the microcrystal region) drastically decreases as compared with before, and semiconductor elements can be formed efficiently, which is effective for the cost reduction. The radio-frequency IC tags can be manufactured so that any radio-frequency IC tag has high quality and no variation of performance.

As thus described, the semiconductor device manufactured by the present invention can be applied to a wide range, and the semiconductor device manufactured by the present invention can be applied to electronic appliances of every field.

Embodiment 8

Various electronic appliances can be completed by mounting TFTs manufactured by the present invention as an integrated CPU, a memory, or an IC, or by using the TFTs as a panel.

Such electronic appliances are, for example, a camera such as a digital video camera or a digital camera, a reflection-type projector, a TV (display), a goggle-type display (head mount display), a navigation system, a sound reproduction device (audio), a mobile terminal (a mobile computer, a mobile phone, a mobile game machine, an electronic book, a mobile sound reproduction device), a game machine, an image reproduction device equipped with a recording medium (specifically an appliance which can reproduce information recorded in the recording medium such as a digital versatile disk (DVD) or a hard disk drive (HDD) and which is equipped with a CPU and a display for displaying the image.

A mobile phone as an example of electronic appliances manufactured by the present invention is hereinafter described with reference to the drawings.

Figure 27:
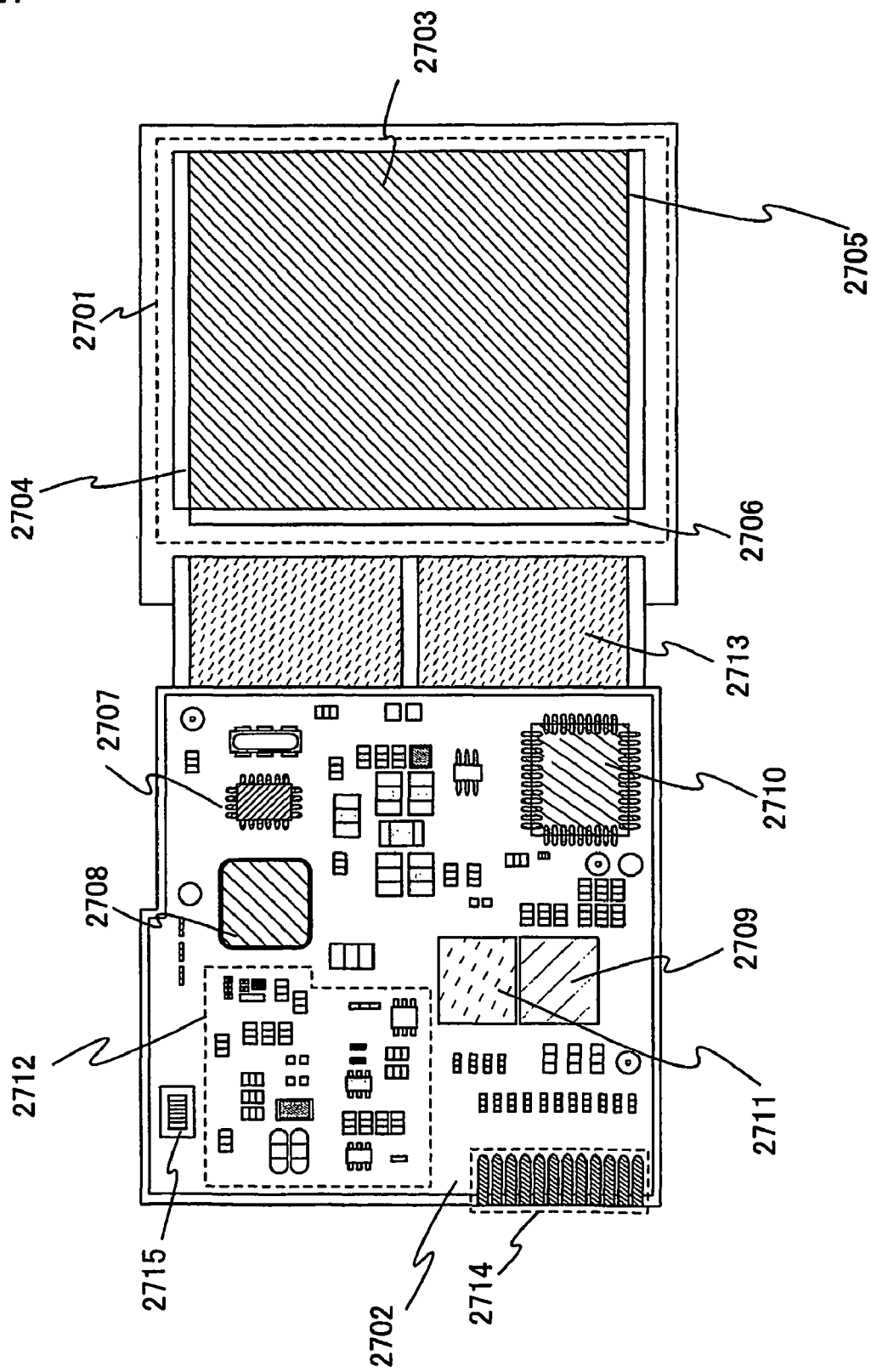
FIG. 27 shows an example of an electronic appliance manufactured by laser irradiation of the present invention.

FIG. 27 shows a module in which a display panel 2701 and a print substrate 2702 are combined. The display panel 2701 is equipped with a pixel portion 2703 in which a light-emitting element is provided in each pixel, a first scanning line driver circuit 2704, a second scanning line driver circuit 2705, and a signal line driver circuit 2706 for supplying video signals to the selected pixel. The element used for the display panel is not limited to a light-emitting element, and a liquid crystal element may also be used.

The print substrate 2702 is equipped with a controller 2707, a central processing unit (CPU) 2708, a memory 2709, a power supply circuit 2710, an audio processing circuit 2711, a sending/receiving circuit 2712, and the like. The print substrate 2702 and the display panel 2701 are connected by a flexible wiring substrate (FPC) 2713. On the print substrate 2702, a capacitor element, a buffer circuit, and the like may be provided so as to prevent noises that interrupt power supply voltage or signals, or dull leading edge of the signals. The controller 2707, the audio processing circuit 2711, the memory 2709, the CPU 2708, the power supply circuit 2710, and the like can be mounted to the display panel 2701 by a COG (Chip On Glass) method. The scale of the print substrate 2702 can be reduced by the COG method.

Various control signals are inputted/outputted through an interface (I/F) portion 2714 equipped in the print substrate 2702. An antenna port 2715 for exchanging signals with the antenna is provided on the print substrate 2702.

Figure 28:
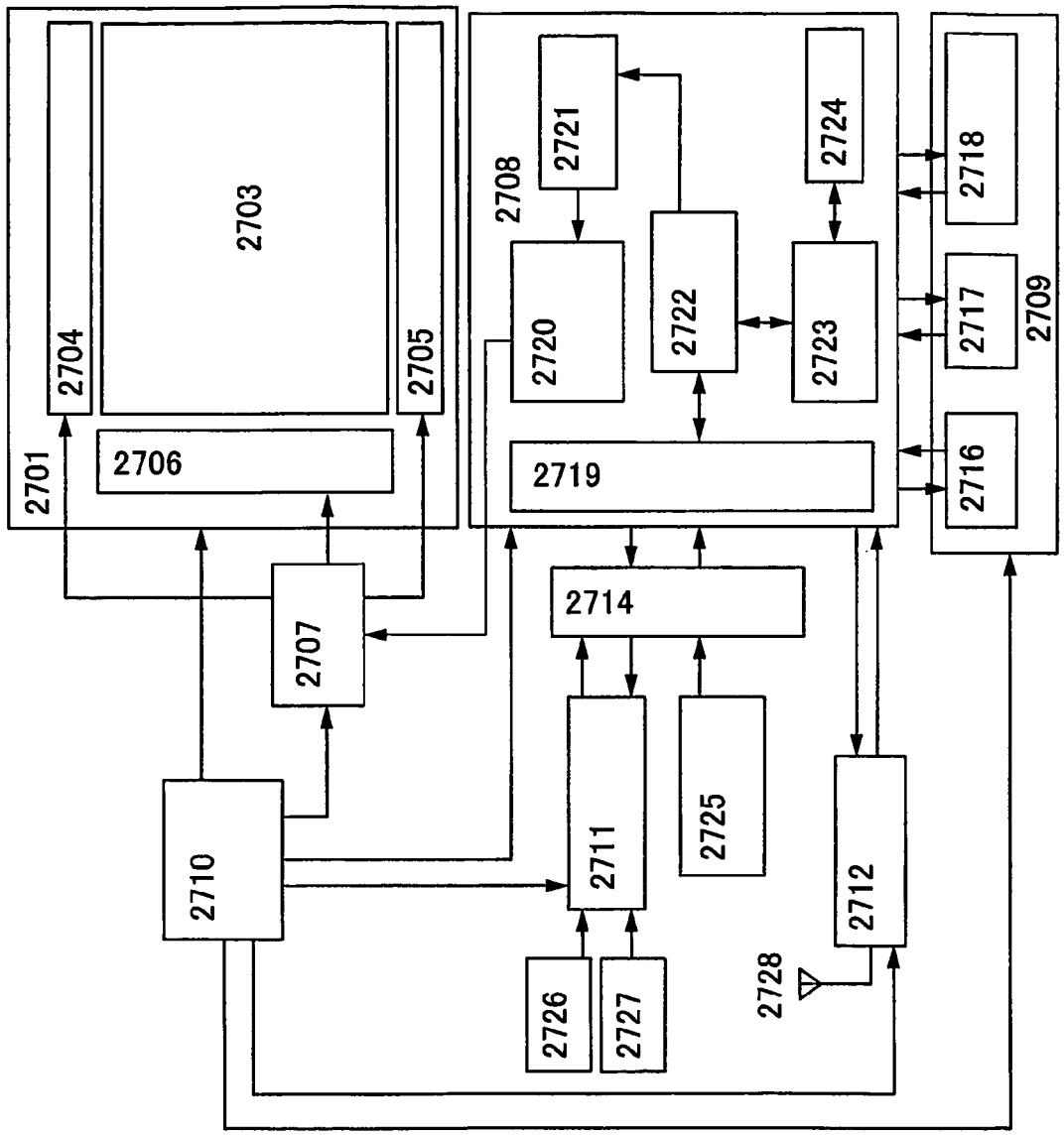
FIG. 28 shows an example of an electronic appliance manufactured by laser irradiation of the present invention.

FIG. 28 is a block diagram of the module shown in FIG. 27. This module includes a VRAM 2716, a DRAM 2717, a flash memory 2718, and the like as a memory 2709. The VRAM 2716 records data of images to be displayed in the panel, the DRAM 2717 records image data or audio data, and the flash memory records various programs.

The power supply circuit 2710 supplies electric power to operate the display panel 2701, the controller 2707, the CPU 2708, the audio processing circuit 2711, the memory 2709, and the sending/receiving circuit 2712. The power supply circuit 2710 may have a current source depending on the specification of a panel.

The CPU 2708 has a control signal generating circuit 2720, a decoder 2721, a resistor 2722, an arithmetic circuit 2723, a RAM 2724, an interface 2719 for the CPU 2708, and the like. Various signals inputted into the CPU 2708 through the interface 2719 are held in the resistor 2722 once, and then the signals are inputted to the arithmetic circuit 2723, the decoder 2712 and the like. The arithmetic circuit 2723 performs an arithmetic operation based on the inputted signal, and designates a location to which various instructions are to be sent. Meanwhile, the signal inputted into the decoder 2721 is decoded and inputted into the control signal generating circuit 2720. The control signal generating circuit 2720 generates signals including various instructions based on the inputted signal and sends the signals to the location designated by the arithmetic circuit 2723, specifically to the memory 2709, the sending/receiving circuit 2712, the audio processing circuit 2711, the controller 2707, and the like.

The memory 2709, the sending/receiving circuit 2712, the audio processing circuit 2711, and the controller 2707 operate in accordance with the received instruction. Their operations are hereinafter described briefly.

The signals inputted from an input means 2725 are sent to the CPU 2708 mounted to the print substrate 2702 through the interface 2714. The control signal generating circuit 2720 converts image data stored in the VRAM 2716 into a predetermined format in accordance with the signal sent from the input means 2725 such as a pointing device or a keyboard, and sends the data to the controller 2707.

The controller 2707 carries out a data process on signals including image data sent from the CPU 2708 in accordance with the specification of the panel, and supplies the signals to the display panel 2701. The controller 2707 generates a Hsync signal, a Vsync signal, a clock signal CLK, an alternating voltage (AC cont), and a switching signal L/R, and supplies these signals to the display panel 2701 in accordance with the power supply voltage input from the power supply circuit 2710, the signals input from the CPU 2708 and the like.

In the sending/receiving circuit 2712, the signals sent/received by the antenna 2728 as electric waves are processed, and the sending/receiving circuit 2712 includes a high-frequency circuit such as an isolator, a band-pass filter, a VCO (voltage controlled oscillator), an LPF (low pass filter), a coupler, or a balun. A signal including audio information among signals exchanged by the sending/receiving circuit 2712 is sent to the audio processing circuit 2711 in accordance with the instruction from the CPU 2708.

The signal including the audio information which has been sent in accordance with the instruction from the CPU 2708 is demodulated into an audio signal in the audio processing circuit 2711 and sent to a speaker 2727. The audio signal sent from a microphone 2726 is demodulated in the audio processing circuit 2711 and then sent to the sending/receiving circuit 2712 in accordance with the instruction from the CPU 2708.

The controller 2707, the CPU 2708, the power supply circuit 2710, the audio processing circuit 2711, and the memory 2709 can be mounted as a package in this embodiment. This embodiment can be applied to any kinds of circuits other than high-frequency circuits such as an isolator, a band-pass filter, a VCO (Voltage Controlled Oscillator), an LPF (Low Pass Filter), a coupler, and a balun.

By applying the present invention, the width of the microcrystal region in the whole width of the laser irradiation region can be decreased to be in the range of 1 to 20 µm. That is to say, the advantageous effect is higher as the length of the beam spot formed on the irradiation surface becomes longer in the major-axis direction, and almost all the laser irradiation regions become large crystal grain regions. Therefore, TFTs formed with this semiconductor film has superior and homogeneous characteristics. Since the restriction on the layout and the size decreases very much, the design rule in manufacturing semiconductor devices can be drastically relaxed. Further, by the present invention, a region which cannot be used as the semiconductor device can be decreased, the yield can be increased, and the cost reduction can be achieved. When these TFTs are integrated and mounted as a CPU, a memory, and an IC or used as a panel, electronic appliances of high quality and having no variation of performance can be manufactured at low cost.

This embodiment can be combined with any one of Embodiment Mode and Embodiments.

The invention claimed is:

1. A method for manufacturing a semiconductor device comprising:
   forming a semiconductor film over a substrate;
   blocking end portions of a first laser beam emitted from a laser oscillator by a slit to produce a second laser beam;
   producing the second laser beam into a third laser beam by using a condensing lens;
   irradiating the semiconductor film with the third laser beam; and
   moving the third laser beam relative to the semiconductor film,
   wherein an image at the slit and an image on the semiconductor film are in a conjugated relation by the condensing lens.

2. A method for manufacturing a semiconductor device comprising:
   forming a semiconductor film over a substrate;
   combining a first laser beam emitted from a first laser oscillator with a second laser beam emitted from a second laser oscillator by a polarizer, the combined laser beam serving as a third laser beam;
   blocking end portions of the third laser beam by a slit to produce a fourth laser beam;
   producing the fourth laser beam into a fifth laser beam by using a condensing lens;
   irradiating the semiconductor film with the fifth laser beam; and
   moving the fifth laser beam relative to the semiconductor film,
   wherein an image at the slit and an image on the semiconductor film are in a conjugated relation by the condensing lens.

3. The method for manufacturing a semiconductor device according to claim 1 or 2,
   wherein the condensing lens is two convex cylindrical lenses or a convex spherical lens.

4. The method for manufacturing a semiconductor device according to claim 1 or 2,
   wherein the laser beam is a continuous wave laser beam.

5. The method for manufacturing a semiconductor device according to claim 4,
   wherein the laser beam is emitted from a laser having a medium of a single-crystal YAG, YVO$_4$, forsterite (Mg$_2$SiO$_4$), YAlO$_3$, or GdVO$_4$, or a poly-crystal (ceramic) YAG, Y$_2$O$_3$, YVO$_4$, YAlO$_3$, or GdVO$_4$, each of which is doped with one or a plurality of elements selected from the group consisting of Nd, Yb, Cr, Ti, Ho, Er, Tm, and Ta as dopant, a solid-state laser such as an alexandrite laser or a Ti:sapphire laser, a gas laser such as an Ar ion laser or a Kr ion laser, or a semiconductor laser such as a GaN laser, a GaAs laser, or an InAs laser.

6. The method for manufacturing a semiconductor device according to claim 1 or 2,
   wherein the laser beam has a pulse width of femtoseconds.

7. The method for manufacturing a semiconductor device according to claim 6,
   wherein the laser beam is emitted from a Ti:sapphire laser, a chromium.forsterite laser, or a Yb:YAG laser.

8. The method for manufacturing a semiconductor device according to claim 1 or 2,
   wherein the laser beam is a pulsed laser beam with a repetition rate of 10 MHz or more.

9. The method for manufacturing a semiconductor device according to claim 8,
   wherein the laser beam is emitted from a laser having a medium of a single-crystal YAG, YVO$_4$, forsterite (Mg$_2$SiO$_4$), YAlO$_3$, or GdVO$_4$, or a poly-crystal (ceramic) YAG, Y$_2$O$_3$, YVO$_4$, YAlO$_3$, or GdVO$_4$, each of which is doped with one or a plurality of elements selected from the group consisting of Nd, Yb, Cr, Ti, Ho, Er, Tm, and Ta as dopant, an Ar ion laser, or a Ti:sapphire laser.

10. The method for manufacturing a semiconductor device according to claim 1 or 2,
    wherein a width of a microcrystal region to a laser irradiation region formed by the irradiation ranges from 1 to 20 µm.

11. The method for manufacturing a semiconductor device according to claim 1 or 2,
    wherein the slit has a blocking plate which is opened and closed.

12. A laser irradiation method comprising:
blocking end portions of a first laser beam emitted from a laser oscillator by a slit to produce a second laser beam;
producing the second laser beam into a third laser beam by using a condensing lens;
irradiating an irradiation surface with the third laser beam; and
moving the third laser beam relative to the irradiation surface,
wherein an image at the slit and an image on the irradiation surface are in a conjugated relation by the condensing lens.

13. A laser irradiation method comprising:
combining a first laser beam emitted from a first laser oscillator with a second laser beam emitted from a second laser oscillator by a polarizer, the combined laser beam serving as a third laser beam;
blocking end portions of the third laser beam by a slit to produce a fourth laser beam;
producing the fourth laser beam into a fifth laser beam by using a condensing lens;
irradiating an irradiation surface with the fifth laser beam; and
moving the fifth laser beam relative to the irradiation surface,
wherein an image at the slit and an image on the irradiation surface are in a conjugated relation by the condensing lens.

14. The laser irradiation method according to claim 12 or 13,
wherein the condensing lens is two convex cylindrical lenses or a convex spherical lens.

15. The laser irradiation method according to claim 12 or 13,
wherein the laser beam is a continuous wave laser beam.

16. The laser irradiation method according to claim 15,
wherein the laser beam is emitted from a laser having a medium of a single-crystal YAG, $YVO_4$, forsterite ($Mg_2SiO_4$), $YAlO_3$, or $GdVO_4$, or a poly-crystal (ceramic) YAG, $Y_2O_3$, $YVO_4$, $YAlO_3$, or $GdVO_4$, each of which is doped with one or a plurality of elements selected from the group consisting of Nd, Yb, Cr, Ti, Ho, Er, Tm, and Ta as dopant, a solid-state laser such as an alexandrite laser or a Ti:sapphire laser, a gas laser such as an Ar ion laser or a Kr ion laser, or a semiconductor laser such as a GaN laser, a GaAs laser, or an InAs laser.

17. The laser irradiation method according to claim 12 or 13,
wherein the laser beam has a pulse width of femtoseconds.

18. The laser irradiation method according to claim 17,
wherein the laser beam is emitted from a Ti:sapphire laser, a chromium.forsterite laser, or a Yb:YAG laser.

19. The laser irradiation method according to claim 12 or 13,
wherein the laser beam is a pulsed laser beam with a repetition rate of 10 MHz or more.

20. The laser irradiation method according to claim 19,
wherein the laser beam is emitted from a laser having a medium of a single-crystal YAG, $YVO_4$, forsterite ($Mg_2SiO_4$), $YAlO_3$, or $GdVO_4$, or a poly-crystal (ceramic) YAG, $Y_2O_3$, $YVO_4$, $YAlO_3$, or $GdVO_4$, each of which is doped with one or a plurality of elements selected from the group consisting of Nd, Yb, Cr, Ti, Ho, Er, Tm, and Ta as dopant, an Ar ion laser, or a Ti:sapphire laser.

21. The laser irradiation method according to claim 12 or 13,
wherein a width of a microcrystal region to a laser irradiation region formed by the laser irradiation apparatus ranges from 1 to 20 μm.

22. The laser irradiation method according to claim 12 or 13,
wherein the slit has a blocking plate which is opened and closed.

23. The method for manufacturing a semiconductor device according to claim 2, wherein the polarizing direction of the first laser beam has been changed by a waveplate.

24. The laser irradiation method according to claim 13, wherein the polarizing direction of the first laser beam has been changed by a waveplate.

* * * * *